(12) United States Patent
Yamashita et al.

(10) Patent No.: US 8,710,617 B2
(45) Date of Patent: Apr. 29, 2014

(54) SEMICONDUCTOR DEVICE ELEMENT FORMED ON SOI SUBSTRATE COMPRISING A HOLLOW REGION, AND HAVING CAPACITORS IN AN ELECTRIC FIELD ALLEVIATION REGION

(71) Applicants: Junichi Yamashita, Tokyo (JP); Tomohide Terashima, Tokyo (JP)

(72) Inventors: Junichi Yamashita, Tokyo (JP); Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/802,538

(22) Filed: Mar. 13, 2013

(65) Prior Publication Data

US 2013/0292740 A1 Nov. 7, 2013

(30) Foreign Application Priority Data

May 1, 2012 (JP) ................................. 2012-104502

(51) Int. Cl.
*H01L 29/02* (2006.01)

(52) U.S. Cl.
USPC ........... 257/496; 257/162; 257/506; 257/517; 257/487; 257/492

(58) Field of Classification Search
None
See application file for complete search history.

(56) References Cited

U.S. PATENT DOCUMENTS

| 5,485,030 | A | 1/1996 | Terashima |
| 5,561,077 | A | 10/1996 | Terashima |
| 2004/0145027 | A1* | 7/2004 | Nitta et al. ..................... 257/492 |
| 2005/0056906 | A1* | 3/2005 | Jimbo et al. ................... 257/492 |
| 2011/0291157 | A1* | 12/2011 | Takahashi et al. ............ 257/144 |

FOREIGN PATENT DOCUMENTS

| JP | 06-188438 A | 7/1994 |
| JP | 2739018 B2 | 1/1998 |
| JP | 2006-148017 A | 6/2006 |
| JP | 2006-173204 A | 6/2006 |

* cited by examiner

*Primary Examiner* — Marcos D. Pizarro
*Assistant Examiner* — Cesar Lopez
(74) *Attorney, Agent, or Firm* — Studebaker & Brackett PC

(57) ABSTRACT

In a region located between a collector electrode and a semiconductor substrate, there are a portion where a hollow region is located and a portion where no hollow region is located. Between the collector electrode and the portion where no hollow region is located in the semiconductor substrate, a floating silicon layer electrically isolated by insulating films is formed.

12 Claims, 19 Drawing Sheets

SEMICONDUCTOR DEVICE ELEMENT FORMED ON SOI SUBSTRATE COMPRISING A HOLLOW REGION, AND HAVING CAPACITORS IN AN ELECTRIC FIELD ALLEVIATION REGION

BACKGROUND OF THE INVENTION

1. Field of the Invention

The present invention relates to a semiconductor device, and particularly to a semiconductor device to which an SOI substrate is applied.

2. Description of the Background Art

In an inverter circuit for operating a load such as induction motor, a lateral insulated gate bipolar transistor (LIGBT), for example, is applied as a switching device. In this type of semiconductor device, an SOI (Silicon On Insulator) substrate is applied as a substrate on which an n-channel LIGBT is formed. In the SOI substrate, an $N^-$ semiconductor layer is formed on a main surface of a semiconductor substrate with an insulating film interposed therebetween.

In the $N^-$ semiconductor layer, a first P-type impurity region is formed from the surface of the $N^-$ semiconductor layer to a predetermined depth. A first N-type impurity region is formed to surround the first P-type impurity region laterally and from below. A collector electrode is formed to contact the surface of the first P-type impurity region. In a portion located directly below the collector electrode and between the $N^-$ semiconductor layer and the semiconductor substrate, a hollow region is formed.

In a predetermined region of the $N^-$ semiconductor layer that is spaced from the first N-type impurity region, a second N-type impurity region is formed from the surface of the $N^-$ semiconductor layer to a predetermined depth. A second P-type impurity region is formed to surround the second N-type impurity region laterally and from below. On the surface of a portion of the second P-type impurity region that is located between the second N-type impurity region and the $N^-$ semiconductor layer, a gate electrode is formed with a gate insulating film interposed therebetween. An emitter electrode is formed to contact the surface of the second P-type impurity region and the surface of the second N-type impurity region. The emitter electrode, the collector electrode, and the gate electrode constitute respective electrodes of the LIGBT.

When the semiconductor device is OFF state, a depletion layer expands from the interface between the second P-type impurity region and the $N^-$ semiconductor layer chiefly toward the $N^-$ semiconductor layer. At this time, the impurity concentration and the thickness of the $N^-$ semiconductor layer can be adjusted to entirely deplete the $N^-$ semiconductor layer and, under the condition that the electric field at the surface of the $N^-$ semiconductor layer is substantially uniform, a maximum breakdown voltage is obtained.

Under this condition, if the distance (spacing) between the emitter (electrode) and the collector (electrode) is increased, finally the breakdown voltage of the whole semiconductor device is restricted due to electric field concentration on a portion of the $N^-$ semiconductor layer that is located directly below the collector (electrode). Although extension of the first N-type impurity region and the collector electrode toward the location of the emitter electrode is unnecessary for the basic operation of the IGBT, it has an effect of restricting expansion of the depletion layer in the vicinity of the surface of the $N^-$ semiconductor layer in the OFF state.

The structure in which the hollow region is formed between the $N^-$ semiconductor layer and the semiconductor substrate is a structure with the purpose of increasing the breakdown voltage, and is proposed for example in PTL 1 (Japanese Patent No. 2739018), PTL 2 (Japanese Patent Laying-Open No. 2006-148017), and PTL 3 (Japanese Patent Laying-Open No. 2006-173204). In a laminate structure made up of a semiconductor substrate (silicon), an insulating film (silicon oxide film), and a hollow region, the field intensity ratio corresponds to the reciprocal of the dielectric constant ratio. Here, since the dielectric constant ratio between the $N^-$ semiconductor layer (silicon), the insulating film (silicon oxide film), and the hollow region is about 12:4:1, the voltage drop across the hollow region can be set large and accordingly the voltage drop across the $N^-$ semiconductor layer can be made small. In this way, the electric field in the $N^-$ semiconductor layer can be alleviated to restrict expansion of the depletion layer, and consequently the breakdown voltage of the semiconductor device can be improved.

SUMMARY OF THE INVENTION

The conventional semiconductor device, however, has the following problem. While the hollow region can contribute to increase of the breakdown voltage of the semiconductor device as described above without affecting the electrical characteristics of a semiconductor element such as LIGBT, the hollow region weakens the mechanical strength of the semiconductor device. Accordingly, there has been a possibility that the semiconductor device is broken due to stress or the like generated when wire bonding to an electrode of a package provided as a semiconductor device is done or when the package is sealed with a resin.

The present invention has been made in the course of the development as described above, and an object of the invention is to provide a semiconductor device having its mechanical strength prevented from being weakened while keeping a high breakdown voltage.

A semiconductor device according to the present invention includes a semiconductor substrate, a first insulating film, a semiconductor layer of a predetermined conductivity type, a second insulating film, and a first electrode. The semiconductor substrate has a main surface with a ground voltage applied to the semiconductor substrate. The first insulating film is formed to cover the main surface of the semiconductor substrate. The semiconductor layer is formed to cover the first insulating film. The second insulating film is formed to cover the semiconductor layer. The first electrode is formed to cover a predetermined region of the second insulating film with a predetermined voltage higher than the ground voltage applied to the first electrode. In a region located between the first electrode and the semiconductor substrate, there are located: a region where a hollow is foiined between the semiconductor substrate and the first insulating film; and a region where no hollow is formed between the semiconductor substrate and the first insulating film. In a portion of the semiconductor layer that is located directly above the region where a hollow is formed, an element-formed region is formed which is electrically connected to the first electrode and in which a predetermined semiconductor element is formed. Between the first electrode and a portion of the semiconductor substrate that is located in the region where no hollow is formed, an electric field alleviation region is formed. In the electric field alleviation region, a plurality of capacitors are formed that are connected in series between the predetermined voltage applied to the first electrode and the ground voltage applied to the semiconductor substrate.

With the semiconductor device according to the present invention, its mechanical strength can be prevented from being weakened while a high breakdown voltage is kept.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Here, a first example of a semiconductor element SE1 (see FIG. 1) formed on an SOI substrate will be described with reference to an n-channel lateral IGBT (LIGBT) by way of example.

Figure 1:
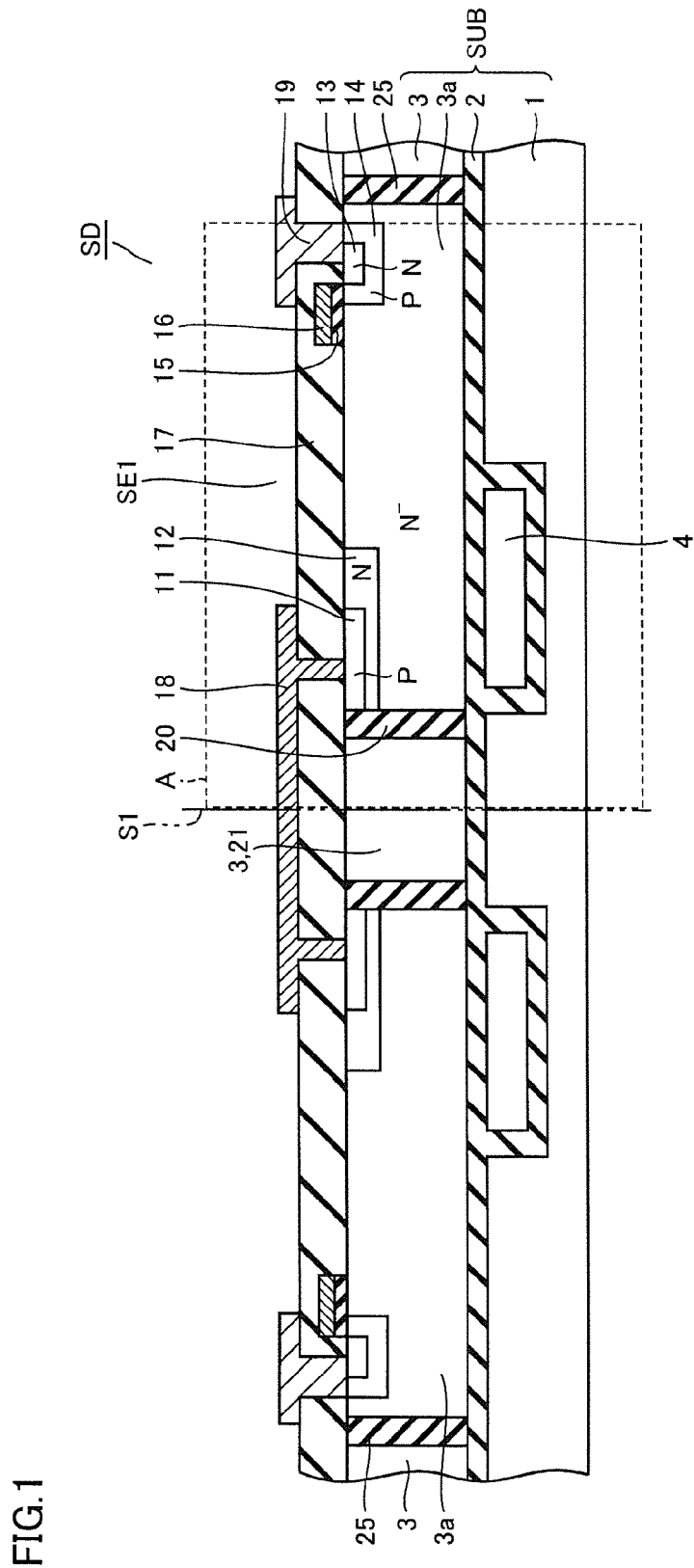
FIG. 1 is a cross-sectional view of a semiconductor device according to a first embodiment of the present invention.

As shown in FIG. 1, in a semiconductor device SD, semiconductor element SE1 has a symmetrical cross-sectional structure with respect to a line S1. As the SOI substrate, an SOI substrate SUB is used in which an N⁻ semiconductor layer 3 having a predetermined thickness is formed on a main surface of a semiconductor substrate 1 with an insulating film 2, which is referred to as BOX (Buried Oxide) layer, interposed therebetween. Here, a region surrounded by an insulating film 25 and isolated from the remaining region is referred to as N⁻ semiconductor layer 3a. In addition, the semiconductor substrate is herein a silicon substrate and the insulating film is herein a silicon oxide film unless otherwise indicated.

As described later herein, at a predetermined position between semiconductor substrate 1 and N⁻ semiconductor layer 3a, a hollow region 4 is formed. In a predetermined region of N⁻ semiconductor layer 3a, a P-type impurity region 11 serving as a collector is formed from the surface of N⁻ semiconductor layer 3a to a predetermined depth. An N-type impurity region 12 serving as a buffer region is formed from the surface of N⁻ semiconductor layer 3a to a deeper depth than P-type impurity region 11 so that N-type impurity region 12 surrounds P-type impurity region 11 laterally and from below.

In a portion of N⁻ semiconductor layer 3a that is spaced from N-type impurity region 12, an N-type impurity region 13 serving as an emitter is formed from the surface of N⁻ semiconductor layer 3a to a predetermined depth. A P-type impurity region 14 serving as a body (base) is formed from the surface of N⁻ semiconductor layer 3a to a deeper depth than N-type impurity region 13 so that P-type impurity region 14 surrounds N-type impurity region 13 laterally and from below. On the surface of a portion of P-type impurity region 14 that is located on the collector side and at least between N-type impurity region 13 and N⁻ semiconductor layer 3a, a gate electrode 16 formed of a polycrystalline silicon film for example is formed with a gate insulating film 15 interposed therebetween.

An insulating film 17 serving as an interlayer insulating film is formed to cover the surface of N⁻ semiconductor layer 3a including gate electrode 16. In a predetermined region of the surface of insulating film 17, a collector electrode 18 formed of a metal film and contacting P-type impurity region 11 through an opening formed in insulating film 17 is formed. On the surface of insulating film 17, an emitter electrode 19 formed of a metal film and contacting N-type impurity region 13 and P-type impurity region 14 through another opening formed in insulating film 17 is formed.

In this semiconductor device SD, the region located between collector electrode 18 and semiconductor substrate 1 includes a portion where hollow region 4 is located and a portion where no hollow region is located. Thus, hollow region 4 is formed so that hollow region 4 is opposite not to the whole of collector electrode 18 but to a part of collector electrode 18. Specifically, no hollow region is formed directly below a central portion of collector electrode 18. The inside of hollow region 4 is filled with air or is vacuum.

Between collector electrode 18 and the portion of semiconductor substrate 1 in which hollow region 4 is not formed, a floating silicon layer 21 (N⁻ semiconductor layer 3) electrically isolated by insulating film 2, an insulating film 20, and insulating film 17 is formed. Insulating films 2, 20, 17 and floating silicon layer 21 alleviate the electric field between collector electrode 18 and the portion of semiconductor substrate 1 in which no hollow region is formed, and thus insulating films 2, 20, 17 and floating silicon layer 21 function as an electric field alleviation region. As seen from the above, this semiconductor device SD is structured so that the hollow region is not arranged in a part of the region located between collector electrode 18 and semiconductor substrate 1.

An operation of semiconductor element SE1 (n-channel LIGBT) in semiconductor device SD as described above will now be described. First, a voltage higher than a predetermined threshold voltage is applied to gate electrode 16 to thereby form an n-type channel in a surface portion of P-type impurity region 14 located directly below gate electrode 16. As the channel is formed, electrons are injected from emitter electrode 19 to N⁻ semiconductor layer 3a through N-type impurity region 13 and the channel, while holes are injected from collector electrode 18 to N⁻ semiconductor layer 3a through P-type impurity region 11. Accordingly, the resistance value of N⁻ semiconductor layer 3a is decreased due to conductivity modulation, which causes a state in which current flows from the collector side toward the emitter side (ON state).

In contrast, application of a voltage lower than the threshold voltage to gate electrode 16 causes the channel formed in P-type impurity region 14 to disappear. As the channel disappears, electrons are stopped from being injected to N⁻ semiconductor layer 3a, the electrons and holes accumulated in N⁻ semiconductor layer 3a are recombined to thereby disappear or discharged to emitter electrode 19 or collector electrode 18 to thereby disappear, resulting in a state in which current is cut off (OFF state).

For the above-described semiconductor device SD, the structure is adopted in which no hollow region is arranged in a part of the region located between collector electrode 18 and semiconductor substrate 1. Accordingly, the mechanical strength of semiconductor device SD can be prevented from being weakened while an adequate breakdown voltage of semiconductor device SD is ensured. This will be explained below in connection with a comparative example.

Figure 2:
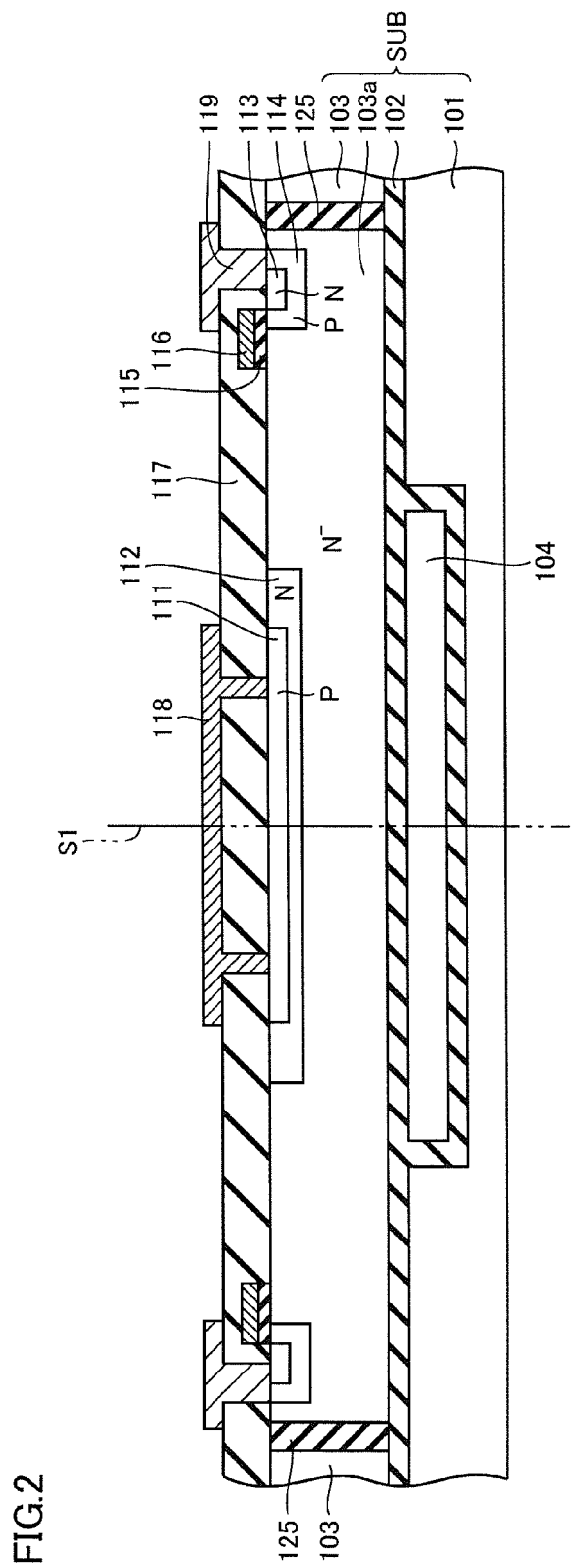
FIG. 2 is a cross-sectional view of a semiconductor device according to a comparative example.

A semiconductor device according to the comparative example is substantially identical to the structure of the semiconductor device shown in FIG. 1, except that, in the region located between the collector electrode and the semiconductor substrate, a hollow region is formed so that the hollow region is opposite to the whole of the collector electrode and no electric field alleviation region is formed. As shown in FIG. 2, an SOI substrate SUB in which an insulating film 102 is interposed between a semiconductor substrate 101 and an N⁻ semiconductor layer 103 is used. In N⁻ semiconductor layer 103, an N⁻ semiconductor layer 103a surrounded by an insulating film 125 and isolated from the remaining region is formed. In a predetermined region of N⁻ semiconductor layer 103a, a P-type impurity region 111 is formed from the surface of N⁻ semiconductor layer 103a to a predetermined depth. An N-type impurity region 112 is formed from the surface of N⁻ semiconductor layer 103a to a deeper depth than P-type impurity region 111 so that N-type impurity region 112 surrounds P-type impurity region 111 laterally and from below.

In a portion of N⁻ semiconductor layer 103a that is spaced from N-type impurity region 112, an N-type impurity region 113 is formed from the surface of N⁻ semiconductor layer 103a to a predetermined depth. A P-type impurity region 114 is formed from the surface of N⁻ semiconductor layer 103a to a deeper depth than N-type impurity region 113 so that P-type impurity region 114 surrounds N-type impurity region 113 laterally and from below. On the surface of a portion of P-type impurity region 114 that is located between N-type impurity region 113 and N⁻ semiconductor layer 103a, a gate electrode 116 is formed with a gate insulating film 115 interposed therebetween.

An insulating film 117 is formed to cover gate electrode 116. In a predetermined region of the surface of insulating film 117, a collector electrode 118 contacting P-type impurity region 111 through an opening formed in insulating film 117 is formed. On the surface of insulating film 117, an emitter electrode 119 contacting N-type impurity region 113 and P-type impurity region 114 through another opening formed in insulating film 117 is formed.

In the semiconductor device of the comparative example, application of a voltage higher than a predetermined threshold voltage to gate electrode 116 causes electrons and holes to be injected to N⁻ semiconductor layer 103a to thereby lower the resistance value of N⁻ semiconductor layer 103a due to conductivity modulation, which causes a state in which current flows from the collector side toward the emitter side (ON state).

In contrast, application of a voltage lower than the threshold voltage to gate electrode 116 stops electrons from being injected to N⁻ semiconductor layer 103a, and the electrons and holes accumulated in N⁻ semiconductor layer 103a are recombined to thereby disappear or discharged to emitter electrode 119 or collector electrode 118 to thereby disappear, which causes a state in which current is cut off (OFF state).

When the semiconductor device (LIGBT) is OFF state, a ground potential (0 V) is applied to emitter electrode 119 and a voltage of approximately 1000 V for example is applied to collector electrode 118, and accordingly N⁻ semiconductor layer 103a is almost entirely depleted. Since N⁻ semiconductor layer 103a is depleted almost entirely, the electric field is strengthened particularly at the interface between insulating film 102 and the portion of N⁻ semiconductor layer 103a that is located directly below collector electrode 118. Then, in order to improve the breakdown voltage, the structure in which a hollow region 104 is provided directly below collector electrode 118 like the comparative example has been adopted. This is for the following reason.

In the semiconductor device of the comparative example, hollow region 104 is formed in the region located between collector electrode 118 and semiconductor substrate 101 so that the hollow region is opposite to the whole of collector electrode 118. In the laminate structure made up of N⁻ semiconductor layer 103a (silicon), insulating film 102 (silicon oxide film), and hollow region 104, the field intensity ratio corresponds to the reciprocal of the dielectric constant ratio. Here, the dielectric constant ratio between N⁻ semiconductor layer 103a (silicon), the insulating film (silicon oxide film), and the hollow region is about 12:4:1. Therefore, the field intensity ratio is 1:3:12. The voltage drop across hollow region 104 can thus be made large and accordingly the voltage drop across N⁻ semiconductor layer 103a can be made small. In this way, the electric field of N⁻ semiconductor layer 103a can be alleviated.

In the semiconductor device of the comparative example, however, there is a possibility that its mechanical strength is weakened since hollow region 104 is formed opposite to the whole of collector electrode 118. There is accordingly a possibility that the semiconductor device is broken by a force exerted when wire bonding, sealing with resin, or the like is performed.

In contrast to the comparative example, the above-described semiconductor device SD includes hollow region 4 formed in the region located between collector electrode 18 and semiconductor substrate 1 so that the hollow region is opposite to a part of collector electrode 18. In a region located directly below collector electrode 18 and between collector electrode 18 and a portion of semiconductor substrate 1 in which no hollow region is formed, an electric field alleviation region ER is formed.

Figure 3:
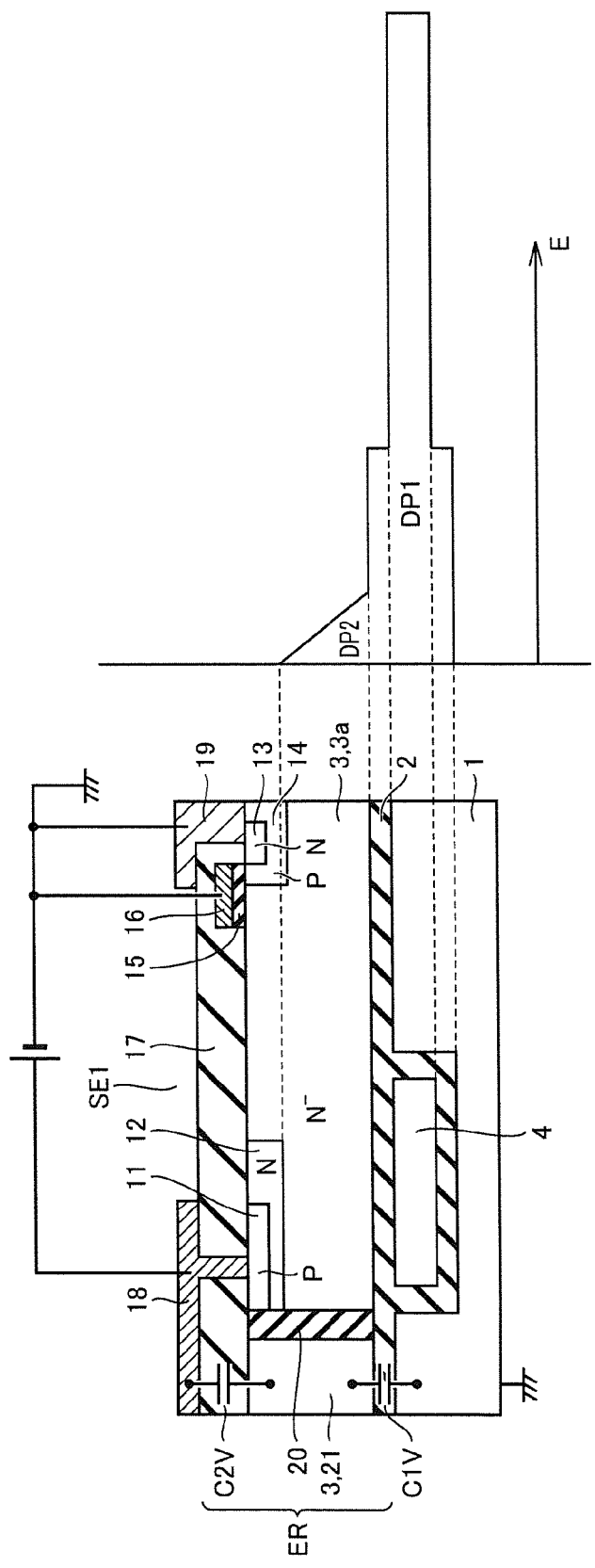
FIG. 3 is a partial cross-sectional view for illustrating an effect of electric field alleviation in the semiconductor device of the first embodiment.

As shown in FIG. 3, in the OFF state, in the electric field between collector electrode 18 (or P-type impurity region 11) to which a high voltage of approximately 1000 V for example is applied and semiconductor substrate 1 fixed at the ground potential, the voltage drop (corresponding to an area DP1) across hollow region 4 can be made sufficiently large and accordingly the voltage drop (corresponding to an area DP2) across $N^-$ semiconductor layer 3a can be made sufficiently small. In this way, the electric field generated at the interface between insulating film 2 and $N^-$ semiconductor layer 3a which has been depleted almost entirely can be alleviated. The electric field profile shown in FIG. 3 is an ideal one extending along a vertical line (not shown) extending through a substantially central portion of hollow region 4.

In the region which is located between semiconductor substrate 1 and collector electrode 18 and in which no hollow region 4 is located, electric field alleviation region ER is formed by insulating films 2, 20, 17 and floating silicon layer 21. Between insulating film 2 and insulating film 17, electrically-isolated floating silicon layer 21 is interposed. Accordingly, in the field alleviation region, a capacitor C1V formed by semiconductor substrate (electrode) 1, insulating film (dielectric) 2, and floating silicon layer (electrode) 21, and a capacitor C2V formed by floating silicon layer (electrode) 21, insulating film (dielectric) 17, and collector electrode (electrode) 18 are connected in series.

Accordingly, the voltage between collector electrode 18 to which a high voltage of approximately 1000 V is applied and semiconductor substrate 1 fixed at the ground potential is dropped by a voltage drop across capacitor C1V and a voltage drop across capacitor C2V, and thus the vertical electric field is alleviated.

Here, it is supposed that, in the case where a high voltage of approximately 1000 V is applied to collector electrode 18, the capacitance (dielectric constant, film thickness, or the like) of insulating film 17 and insulating film 2 is adjusted to set the voltage across floating silicon layer 21 to 500 V for example. Then, regarding insulating film 2 to which a thermal oxide film is usually applied, a breakdown voltage of 500 V can be ensured when insulating film 2 has a film thickness of approximately 1.5 μm. As for insulating film 17 to which a CVD (Chemical Vapor Deposition) oxide film is applied, a breakdown voltage of 500 V can be ensured when insulating film 17 has a film thickness of approximately 5 μm, and moreover, it can be formed without increasing the production cost. Accordingly, the electric field between collector electrode 18 and the portion of semiconductor substrate 1 in which no hollow region is formed is alleviated and an adequate breakdown voltage is ensured.

Thus, in the above-described semiconductor device SD, hollow region 4 is formed in a region located between collector electrode 18 and semiconductor substrate 1 so that the hollow region is opposite to a part of collector electrode 18. Meanwhile, the region in which no hollow region is formed is provided with electric field alleviation region ER. Accordingly, as compared with the semiconductor device (comparative example) in which a hollow region is formed to be opposite to the whole of the collector electrode, the mechanical strength of semiconductor device SD can be prevented from being weakened while an adequate breakdown voltage is ensured. Particularly in such a case where a wire is directly bonded to collector electrode 18, semiconductor device SD can be prevented from being damaged.

Second Embodiment

Here, a second example of semiconductor element SE1 (see FIG. 4) formed on an SOI substrate will be described with reference to an n-channel lateral IGBT (LIGBT) by way of example. Regarding the following embodiments each, the structure of the semiconductor device will be illustrated by means of a right half region relative to line S1 (see frame A in FIG. 1) in view of the symmetry of the semiconductor element, for the sake of simplifying the drawings.

In the above-described semiconductor device (see FIG. 1), when semiconductor element (n-channel LIGBT) SE1 is OFF state, a portion of $N^-$ semiconductor layer 3a that is located on the insulating film 20 side is depleted. Therefore, the electric field between $N^-$ semiconductor layer 3a and floating silicon layer 21 is weaker than the electric field between collector electrode 18 and semiconductor substrate 1. However, although the electric field is weaker, an adequate breakdown voltage between $N^-$ semiconductor layer 3a and floating silicon layer 21 must be ensured if the thickness of insulating film 20 which electrically insulates $N^-$ semiconductor layer 3a and floating silicon layer 21 from each other is thin. The second example provides an example scheme for ensuring an adequate breakdown voltage.

Figure 4:
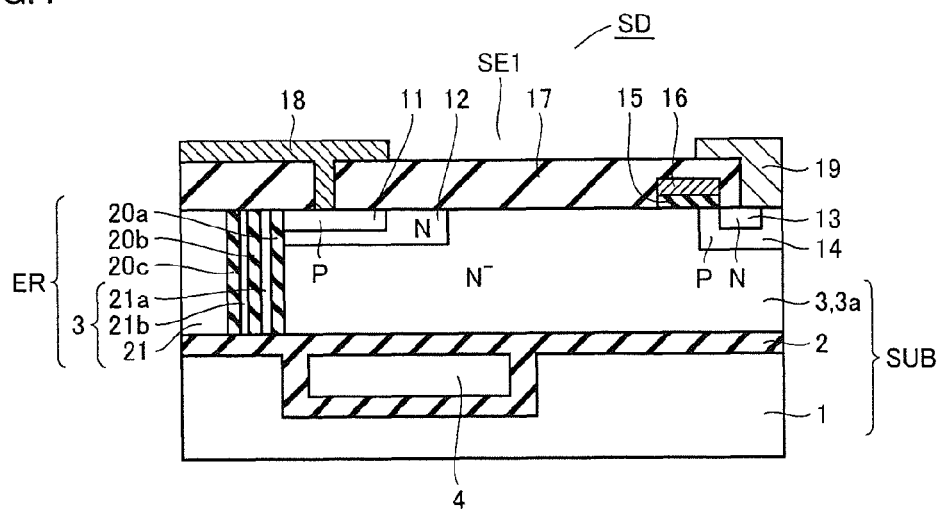
FIG. 4 is a partial cross-sectional view of a semiconductor device according to a second embodiment of the present invention.

As shown in FIG. 4, in an electric field alleviation region ER of semiconductor device SD of the present embodiment, insulating films 20a, 20b, 20c extending from the surface of $N^-$ semiconductor layer 3 to insulating film 2 are formed in $N^-$ semiconductor layer 3 so that they are spaced from each other. Between insulating film 20a and insulating film 20b, an electrically-isolated floating silicon layer 21a formed of a part of $N^-$ semiconductor layer 3 is located. Between insulating film 20b and insulating film 20c, an electrically-isolated floating silicon layer 21b formed of a part of $N^-$ semiconductor layer 3 is located.

Features other than those described above are similar to those of semiconductor device SD shown in FIG. 1, and therefore the same components are denoted by the same reference characters and the description thereof will not be repeated.

In semiconductor element SE1 (n-channel LIGBT) of semiconductor device SD as described above, application of a voltage higher than a predetermined threshold voltage to gate electrode 16 causes electrons and holes to be injected to $N^-$ semiconductor layer 3a to thereby lower the resistance value of $N^-$ semiconductor layer 3a due to conductivity modulation, which causes a state in which current flows from the collector side toward the emitter side (ON state).

In contrast, application of a voltage lower than the threshold voltage to gate electrode 16 stops electrons from being injected to $N^-$ semiconductor layer 3a, and the electrons and holes accumulated in $N^-$ semiconductor layer 3a are recombined to thereby disappear or discharged to emitter electrode 19 or collector electrode 18 to thereby disappear, resulting in a state in which current is cut off (OFF state).

In the above-described semiconductor device SD, when semiconductor element SE1 (n-channel LIGBT) is OFF state, the ground potential is applied to emitter electrode 19 and a voltage of approximately 1000 V for example is applied to collector electrode 18, and accordingly $N^-$ semiconductor layer 3a is depleted almost entirely. At this time, the electric field generated at the interface between insulating film 2 and almost entirely depleted $N^-$ semiconductor layer 3a is alleviated by hollow region 4 as described above.

In the region which is located between semiconductor substrate 1 and collector electrode 18 and in which hollow region 4 is not located, electric field alleviation region ER is formed by insulating films 20a, 20b, 20c and floating silicon layers 21a, 21b in addition to insulating films 2, 17 and floating silicon layer 21.

Figure 5:
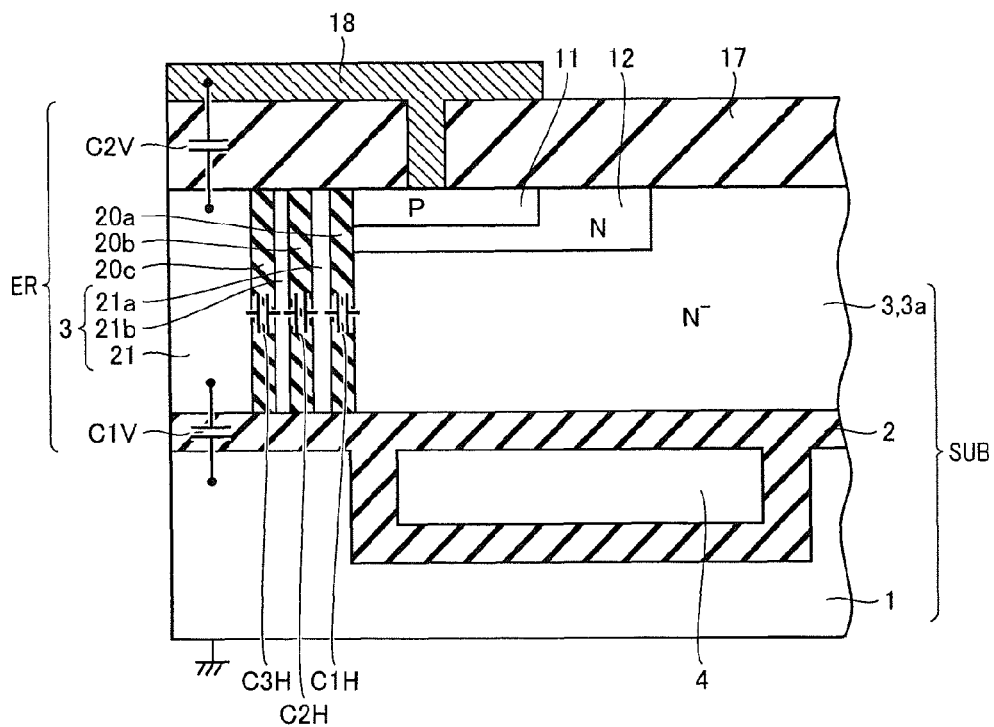
FIG. 5 is a partial cross-sectional view for illustrating an effect of electric field alleviation in the semiconductor device of the second embodiment.

Therefore, as shown in FIG. 5, electric field alleviation region ER includes, in addition to the structure in which capacitor C1V and capacitor C2V are connected in series, a structure in which a capacitor C1H formed by $N^-$ semiconductor layer (electrode) 3a, insulating film (dielectric) 20a, and floating silicon layer (electrode) 21a, a capacitor C2H formed by floating silicon layer (electrode) 21a, insulating film (dielectric) 20b, and floating silicon layer (electrode) 21b, and a capacitor C3H formed by floating silicon layer (electrode) 21b, insulating film (dielectric) 20c, and floating silicon layer (electrode) 21, are connected in series.

Accordingly, the voltage between collector electrode 18 ($N^-$ semiconductor layer 3a) to which a high voltage of approximately 1000 V is applied and floating silicon layer 21 is dropped by a voltage drop across capacitor C1H, a voltage drop across capacitor C2H, and a voltage drop across capacitor C3H, and thus the lateral electric field is alleviated.

Here, it is supposed that, in the case where a high voltage of approximately 1000 V is applied to collector electrode 18, the capacitance (dielectric constant, film thickness, or the like) of insulating film 17 and insulating film 2 is adjusted to set the voltage across floating silicon layer 21 to 500 V for example. Regarding an insulating film to which a CVD oxide film is applied, as described above, a breakdown voltage of 500 V can be ensured when the insulating film has a film thickness of approximately 5 μm.

Then, regarding the structure in which capacitor C1H, capacitor C2H, and capacitor C3H are connected in series, insulating films 20a, 20b, 20c may have respective thicknesses of approximately one third of 5 μm (about 1.7 μm) to ensure a breakdown voltage of 500 V. Accordingly, the same breakdown voltage can be ensured with a reduced production cost. Namely, in the case where three openings each having a width of about 1.7 μm, which corresponds to the film thickness, are spaced from each other and filled with an insulating film in $N^-$ semiconductor layer 3a, the thickness of the insulating film to be deposited is smaller than that in the case where an opening having a width of about 5 μm is formed and filled with an insulating film.

If insulating films of the same thickness are to be formed, the breakdown voltage obtained by forming three insulating films 20a, 20b, 20c is larger than that obtained by forming one insulating film. It should be noted that the vertical electric field is alleviated by series-connected capacitors C1V and C2V as described above.

Thus, in above-described semiconductor device SD, the region located between collector electrode 18 and semiconductor substrate 1 is provided with hollow region 4 which is formed so that hollow region 4 is opposite to a part of collector electrode 18, as well as a region in which no hollow region is formed, and accordingly, as compared with the semiconductor device (comparative example) in which a hollow region is formed so that the hollow region is opposite to the whole of the collector electrode, the mechanical strength of semiconductor device SD can be prevented from being weakened while the vertical and lateral breakdown voltages are adequately ensured.

Third Embodiment

Here, a third example of semiconductor element SE1 (see FIG. 6) formed on an SOI substrate will be described with reference to an n-channel lateral IGBT (LIGBT) by way of example. The third example is another example of the scheme for ensuring an adequate breakdown voltage between $N^-$ semiconductor layer 3a and floating silicon layer 21 as described above.

Figure 6:
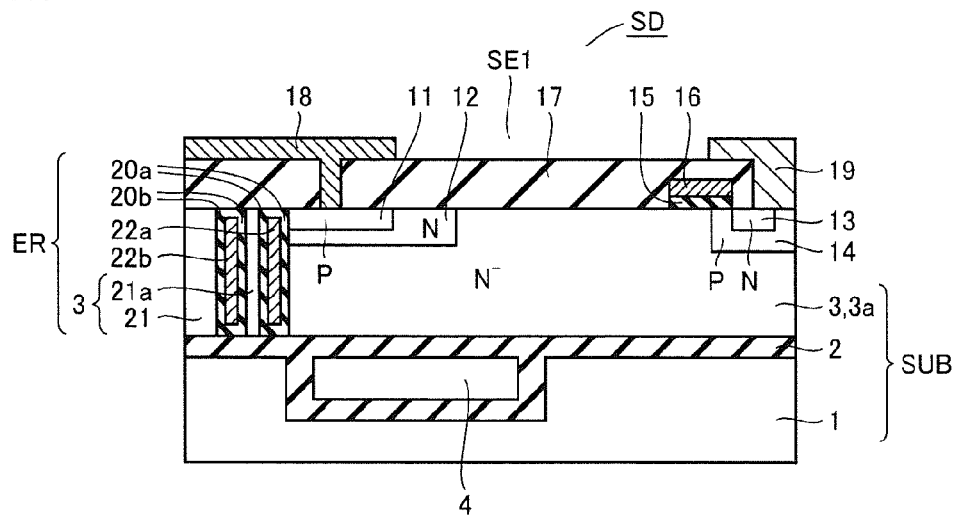
FIG. 6 is a partial cross-sectional view of a semiconductor device according to a third embodiment of the present invention.

In an electric field alleviation region ER of the present semiconductor device, a trench isolation structure for electrically isolating a semiconductor element such as LIGBT from another semiconductor element is used. As shown in FIG. 6, insulating films 20a, 20b are formed to cover respective side walls of trenches extending from the surface of $N^-$ semiconductor layer 3 to insulating film 2, and polysilicon films 22a, 22b which are each isolated electrically are formed to fill the trenches respectively.

Between these trenches, an electrically-isolated floating silicon layer 21a formed of a part of $N^-$ semiconductor layer 3 is located. Features other than those described above are similar to those of semiconductor device SD shown in FIG. 1, and therefore the same components are denoted by the same reference characters and the description thereof will not be repeated.

In semiconductor element SE1 (n-channel LIGBT) of semiconductor device SD as described above, application of a voltage higher than a predetermined threshold voltage to gate electrode 16 causes electrons and holes to be injected to $N^-$ semiconductor layer 3a to thereby lower the resistance value of $N^-$ semiconductor layer 3a due to conductivity modulation, which causes a state in which current flows from the collector side toward the emitter side (ON state).

In contrast, application of a voltage lower than the threshold voltage to gate electrode 16 stops electrons from being injected to $N^-$ semiconductor layer 3a, and the electrons and holes accumulated in $N^-$ semiconductor layer 3a are recombined to thereby disappear or discharged to emitter electrode 19 or collector electrode 18 to thereby disappear, resulting in a state in which current is cut off (OFF state).

In the above-described semiconductor device SD, when semiconductor element SE1 (n-channel LIGBT) is OFF state, the ground potential is applied to emitter electrode 19 and a voltage of approximately 1000 V for example is applied to collector electrode 18, and accordingly $N^-$ semiconductor layer 3a is depleted almost entirely. At this time, the electric field generated at the interface between insulating film 2 and almost entirely depleted $N^-$ semiconductor layer 3a is alleviated by hollow region 4 as described above.

In the region which is located between semiconductor substrate 1 and collector electrode 18 and in which hollow region 4 is not located, electric field alleviation region ER is formed by insulating film 20a (20b) and polysilicon film 22a (22b) filling the trench, in addition to insulating films 2, 17 and floating silicon layer 21.

Figure 7:
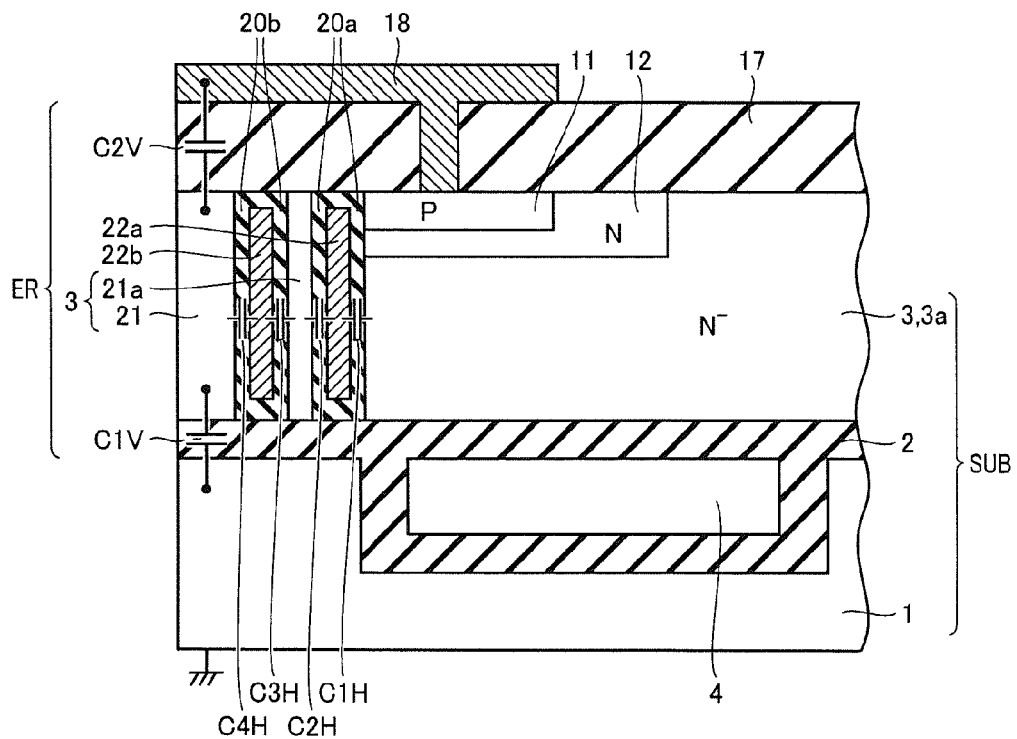
FIG. 7 is a partial cross-sectional view for illustrating an effect of electric field alleviation in the semiconductor device of the third embodiment.

Therefore, as shown in FIG. 7, electric field alleviation region ER includes, in addition to the structure in which capacitor C1V and capacitor C2V are connected in series, a structure in which a capacitor C1H formed by $N^-$ semiconductor layer (electrode) 3a, insulating film (dielectric) 20a, and polysilicon film (electrode) 22a, a capacitor C2H formed by polysilicon film (electrode) 22a, insulating film (dielectric) 20a, and floating silicon layer (electrode) 21a, a capacitor C3H formed by floating silicon layer (electrode) 21a, insulating film (dielectric) 20b, and polysilicon film (electrode) 22b, and a capacitor C4H formed by polysilicon film (electrode) 22b, insulating film (dielectric) 20b, and floating silicon layer (electrode) 21 are connected in series.

Accordingly, the voltage between collector electrode 18 (N⁻ semiconductor layer 3a) to which a high voltage of approximately 1000 V is applied and floating silicon layer 21 is dropped by a voltage drop across capacitor C1H, a voltage drop across capacitor C2H, a voltage drop across capacitor C3H, and a voltage drop across capacitor C4H. Consequently, in semiconductor device SD, particularly the lateral electric field is alleviated. Moreover, electric field alleviation region ER is formed simultaneously with the trench isolation structure provided for electrically isolating the semiconductor element, and therefore, electric field alleviation region ER can be formed without increasing the number of manufacturing steps.

Thus, in above-described semiconductor device SD, the region located between collector electrode 18 and semiconductor substrate 1 is provided with hollow region 4 which is formed so that hollow region 4 is opposite to a part of collector electrode 18, as well as a region in which no hollow region is formed, and accordingly, as compared with the semiconductor device (comparative example) in which a hollow region is formed so that the hollow region is opposite to the whole of the collector electrode, the mechanical strength of semiconductor device SD can be prevented from being weakened while the vertical and lateral breakdown voltages are adequately ensured.

Fourth Embodiment

Here, a fourth example of semiconductor element SE1 (see FIG. 8) formed on an SOI substrate will be described with reference to an n-channel lateral IGBT (LIGBT) by way of example.

Figure 8:
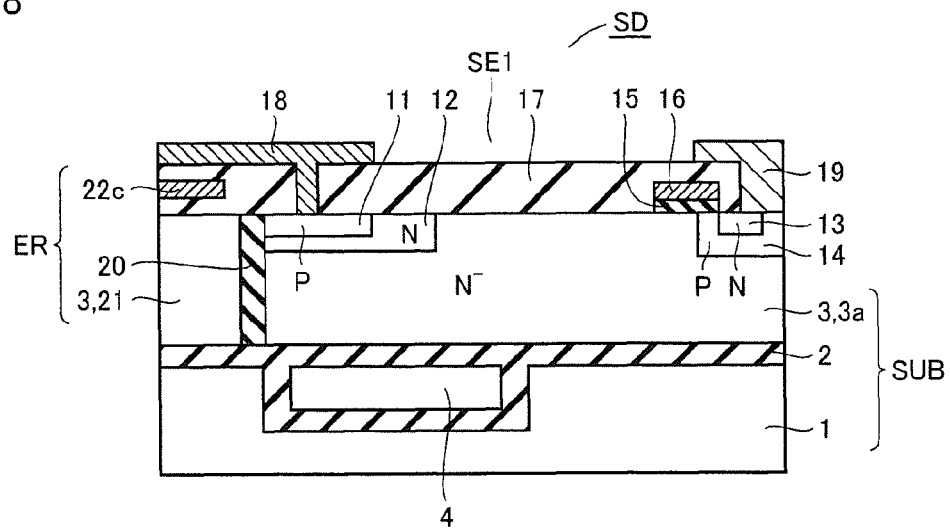
FIG. 8 is a partial cross-sectional view of a semiconductor device according to a fourth embodiment of the present invention.

As shown in FIG. 8, in the present semiconductor device SD, an electrically-isolated polysilicon film 22c is formed in insulating film 17. Features other than those described above are similar to those of semiconductor device SD shown in FIG. 1, and therefore the same components are denoted by the same reference characters and the description thereof will not be repeated.

In semiconductor element SE1 (n-channel LIGBT) of semiconductor device SD as described above, application of a voltage higher than a predetermined threshold voltage to gate electrode 16 causes electrons and holes to be injected to N⁻ semiconductor layer 3a to thereby lower the resistance value of N⁻ semiconductor layer 3a due to conductivity modulation, which causes a state in which current flows from the collector side toward the emitter side (ON state).

In contrast, application of a voltage lower than the threshold voltage to gate electrode 16 stops electrons from being injected to N⁻ semiconductor layer 3a, and the electrons and holes accumulated in N⁻ semiconductor layer 3a are recombined to thereby disappear or discharged to emitter electrode 19 or collector electrode 18 to thereby disappear, resulting in a state in which current is cut off (OFF state).

In the above-described semiconductor device SD, when semiconductor element SE1 (n-channel LIGBT) is OFF state, the ground potential is applied to emitter electrode 19 and a voltage of approximately 1000 V for example is applied to collector electrode 18, and accordingly N⁻ semiconductor layer 3a is depleted almost entirely. At this time, the electric field generated at the interface between insulating film 2 and almost entirely depleted N⁻ semiconductor layer 3a is alleviated by hollow region 4 as described above.

In the region which is located between semiconductor substrate 1 and collector electrode 18 and in which hollow region 4 is not located, an electric field alleviation region ER is formed by polysilicon film 22c formed in insulating film 17, in addition to insulating films 2, 20, 17 and floating silicon layer 21.

Figure 9:
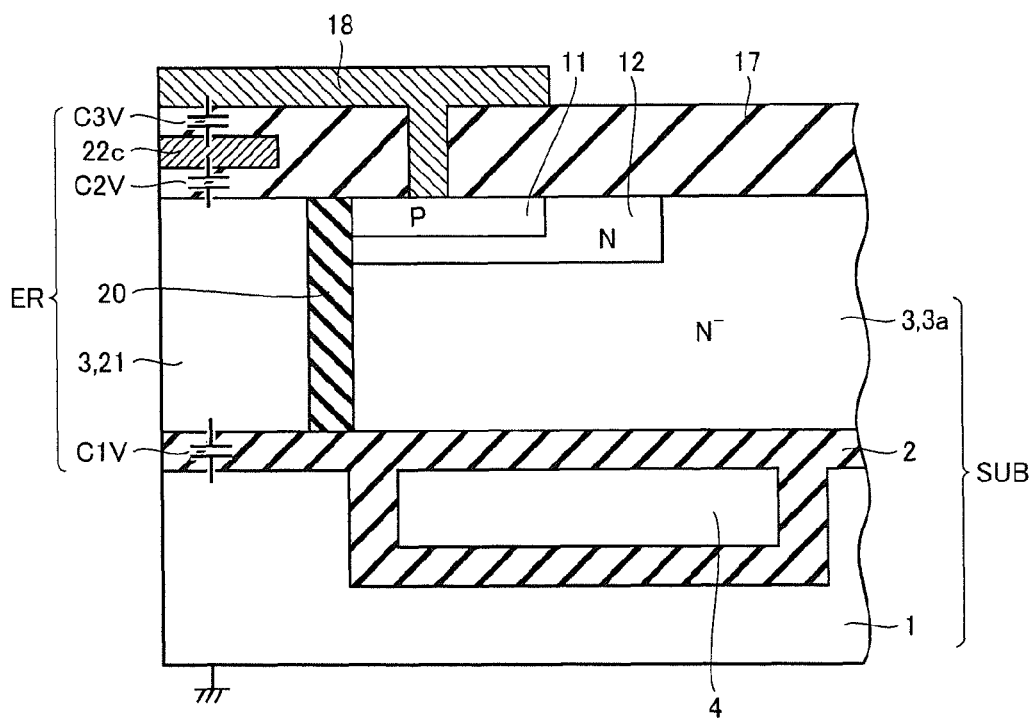
FIG. 9 is a partial cross-sectional view for illustrating an effect of electric field alleviation in the semiconductor device of the fourth embodiment.

Therefore, as shown in FIG. 9, electric field alleviation region ER includes a structure in which, in addition to capacitor C1V, a capacitor C2V formed by floating silicon layer (electrode) 21, insulating film (dielectric) 17, and polysilicon film (electrode) 22c, and a capacitor C3V formed by polysilicon film (electrode) 22c, insulating film (dielectric) 17, and collector electrode (electrode) 18 are connected in series.

Accordingly, the voltage between collector electrode 18 to which a high voltage of approximately 1000 V is applied and a portion of semiconductor substrate 1 in which no hollow region is formed is dropped by a voltage drop across capacitor C1V, a voltage drop across capacitor C2V, and a voltage drop across capacitor C3V. Consequently, in semiconductor device SD, particularly the vertical electric field is alleviated. Moreover, polysilicon film 22c is formed simultaneously with gate electrode 16 of the LIGBT, and therefore, electric field alleviation region ER can be formed without increasing the number of manufacturing steps.

Thus, in above-described semiconductor device SD, the region located between collector electrode 18 and semiconductor substrate 1 is provided with hollow region 4 which is formed so that hollow region 4 is opposite to a part of collector electrode 18, as well as a region in which no hollow region is formed, and accordingly, as compared with the semiconductor device (comparative example) in which a hollow region is formed so that the hollow region is opposite to the whole of the collector electrode, the mechanical strength of semiconductor device SD can be prevented from being weakened while especially the vertical breakdown voltage is adequately ensured.

Fifth Embodiment

Here, a fifth example of semiconductor element SE1 (see FIG. 10) formed on an SOI substrate will be described with reference to an n-channel lateral IGBT (LIGBT) by way of example.

Figure 10:
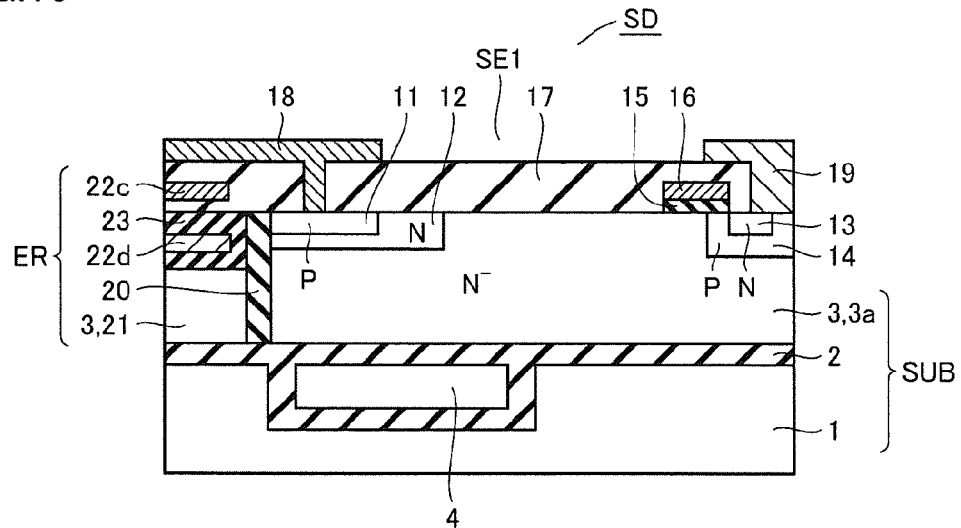
FIG. 10 is a partial cross-sectional view of a semiconductor device according to a fifth embodiment of the present invention.

As shown in FIG. 10, in the present semiconductor device SD, an electrically-isolated polysilicon film 22c is formed in insulating film 17. Between insulating film 17 and floating silicon layer 21, an insulating film 23 is formed. In this insulating film 23, an electrically-isolated polysilicon film 22d is formed. Features other than those described above are similar to those of semiconductor device SD shown in FIG. 1, and therefore the same components are denoted by the same reference characters and the description thereof will not be repeated.

In semiconductor element SE1 (n-channel LIGBT) of semiconductor device SD as described above, application of a voltage higher than a predetermined threshold voltage to gate electrode 16 causes electrons and holes to be injected to N⁻ semiconductor layer 3a to thereby lower the resistance value of N⁻ semiconductor layer 3a due to conductivity modulation, which causes a state in which current flows from the collector side toward the emitter side (ON state).

In contrast, application of a voltage lower than the threshold voltage to gate electrode 16 stops electrons from being injected to N⁻ semiconductor layer 3a, and the electrons and holes accumulated in N⁻ semiconductor layer 3a are recombined to thereby disappear or discharged to emitter electrode 19 or collector electrode 18 to thereby disappear, resulting in a state in which current is cut off (OFF state).

In the above-described semiconductor device SD, when semiconductor element SE1 (n-channel LIGBT) is OFF state, the ground potential is applied to emitter electrode 19 and a voltage of approximately 1000 V for example is applied to collector electrode 18, and accordingly N⁻ semiconductor layer 3a is depleted almost entirely. At this time, the electric field generated at the interface between insulating film 2 and almost entirely depleted N⁻ semiconductor layer 3a is alleviated by hollow region 4 as described above.

In the region which is located between semiconductor substrate 1 and collector electrode 18 and in which hollow region 4 is not located, an electric field alleviation region ER is formed by polysilicon film 22c formed in insulating film 17, insulating film 23, and polysilicon film 22d formed in insulating film 23, in addition to insulating films 2, 20, 17 and floating silicon layer 21.

Figure 11:
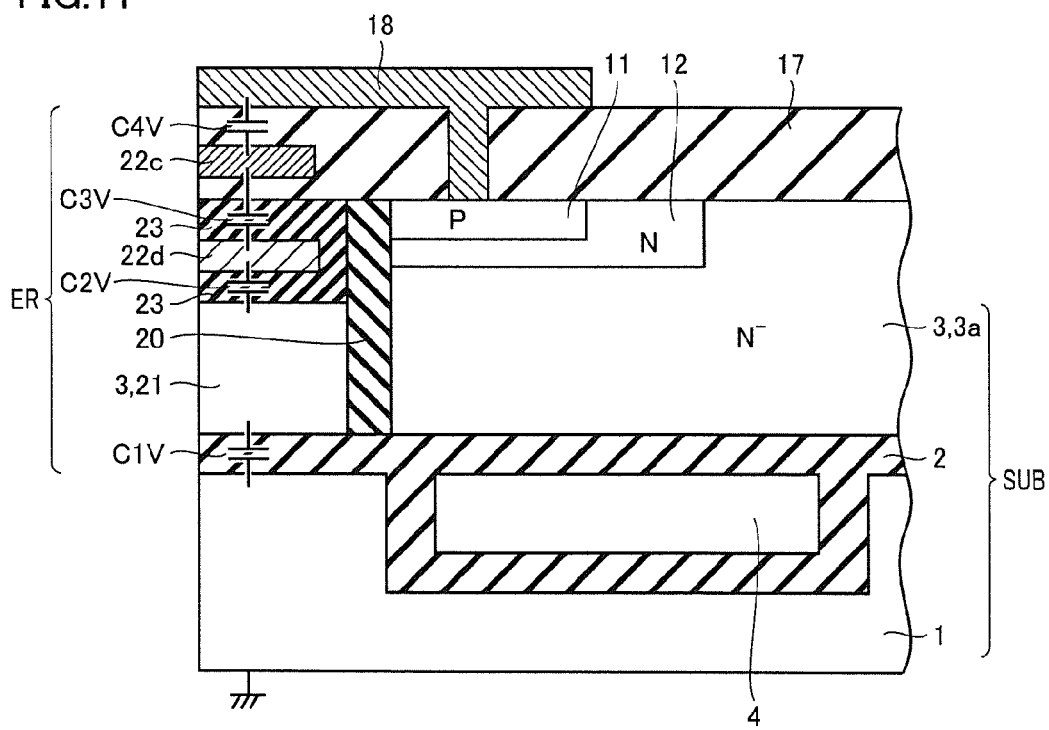
FIG. 11 is a partial cross-sectional view for illustrating an effect of electric field alleviation in the semiconductor device of the fifth embodiment.

Therefore, as shown in FIG. 11, electric field alleviation region ER includes a structure in which, in addition to capacitor C1V, a capacitor C2V formed by floating silicon layer (electrode) 21, insulating film (dielectric) 23, and polysilicon film (electrode) 22d, a capacitor C3V formed by polysilicon film (electrode) 22d, insulating films (dielectric) 23, 17, and polysilicon film (electrode) 22c, and capacitor C4V formed by polysilicon film (electrode) 22c, insulating film (dielectric) 17, and collector electrode (electrode) 18 are connected in series.

Accordingly, the voltage between collector electrode 18 to which a high voltage of approximately 1000 V is applied and a portion of semiconductor substrate 1 in which no hollow region is formed is dropped by a voltage drop across capacitor C1V, a voltage drop across capacitor C2V, a voltage drop across capacitor C3V, and a voltage drop across capacitor C4V. Consequently, in semiconductor device SD, particularly the vertical electric field is alleviated.

Thus, in above-described semiconductor device SD, the region located between collector electrode 18 and semiconductor substrate 1 is provided with hollow region 4 which is formed so that hollow region 4 is opposite to a part of collector electrode 18, as well as a region in which no hollow region is formed, and accordingly, as compared with the semiconductor device (comparative example) in which a hollow region is formed so that the hollow region is opposite to the whole of the collector electrode, the mechanical strength of semiconductor device SD can be prevented from being weakened while especially the vertical breakdown voltage is adequately ensured.

Sixth Embodiment

Here, a semiconductor element SE2 (see FIGS. 12 to 16) formed on an SOI substrate will be described with reference to an n-channel lateral DMOS (LDMOS: Lateral Double Diffused Metal Oxide Semiconductor) by way of example.

First Example

Figure 12:
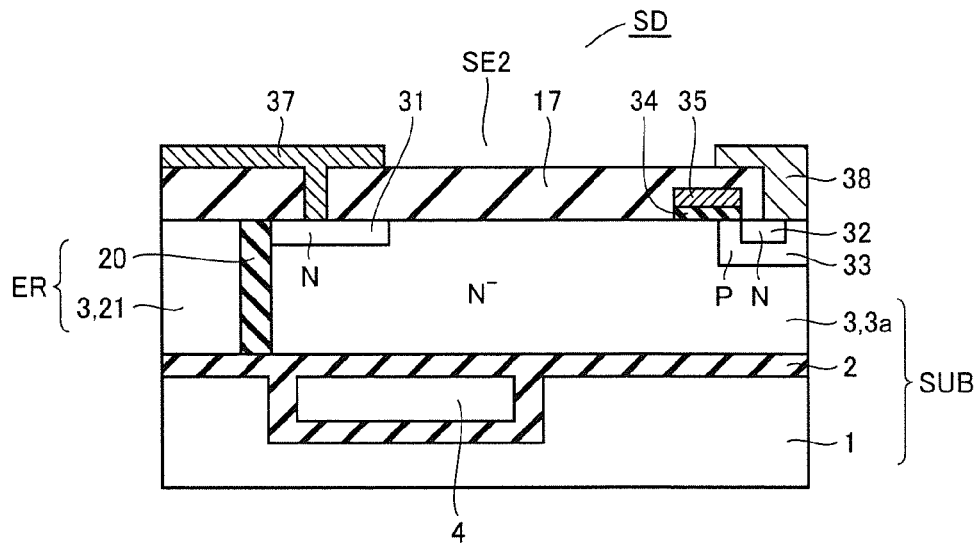
FIG. 12 is a partial cross-sectional view of a semiconductor device of a first example among semiconductor devices according to a sixth embodiment of the present invention.

As shown in FIG. 12, in a portion (N⁻ semiconductor layer 3a) located in a predetermined region of N⁻ semiconductor layer 3, an N-type impurity region 31 serving as a drain is formed from the surface of N⁻ semiconductor layer 3a to a predetermined depth. In a portion of N⁻ semiconductor layer 3a spaced from N-type impurity region 31, an N-type impurity region 32 serving as a source is formed from the surface of N⁻ semiconductor layer 3a to a predetermined depth.

A P-type impurity region 33 serving as a body (base) is formed from the surface of N⁻ semiconductor layer 3a to a deeper depth than N-type impurity region 32 so that P-type impurity region 33 surrounds N-type impurity region 32 laterally and from below. On the surface of a portion of P-type impurity region 33 that is located between N-type impurity region 32 and N⁻ semiconductor layer 3a, a gate electrode 35 is formed with a gate insulating film 34 interposed therebetween.

An insulating film 17 is formed to cover gate electrode 35. In a predetermined region of the surface of insulating film 17, a drain electrode 37 contacting N-type impurity region 31 through an opening formed in insulating film 17 is formed. On a surface of insulating film 17, a source electrode 38 contacting N-type impurity region 32 and P-type impurity region 33 through another opening formed in the insulating film is formed.

Features other than those described above such as hollow region 4 and electric field alleviation region ER are similar to those of semiconductor device SD shown in FIG. 1, and therefore the same components are denoted by the same reference characters and the description thereof will not be repeated.

In the following, an operation will be described of semiconductor element SE2 (n-channel LDMOS) in semiconductor device SD as described above. Application of a voltage higher than a predetermined threshold voltage to gate electrode 35 causes an n-type channel to be formed in a portion of P-type impurity region 33 that is located directly below gate electrode 35. As the channel is formed, electrons flow from source electrode 38 through N-type impurity region 32 and the channel to N⁻ semiconductor layer 3a. Accordingly, a state is caused in which current flows from the drain side toward the source side (ON state).

In contrast, application of a voltage lower than the threshold voltage to gate electrode 35 causes the channel formed in P-type impurity region 33 to disappear. As the channel disappears, electrons are stopped from flowing toward N⁻ semiconductor layer 3a, which causes a state in which current is cut off (OFF state).

When semiconductor element SE2 (n-channel LDMOS) in above-described semiconductor device SD is OFF state, the ground potential is applied to source electrode 38 and a voltage of approximately 1000 V for example is applied to drain electrode 37, and accordingly N⁻ semiconductor layer 3a is almost entirely depleted. At this time, as described above in connection with the first embodiment, the electric field generated at the interface between insulating film 2 and N⁻ semiconductor layer 3a which has been depleted almost entirely is alleviated by hollow region 4.

In a region between semiconductor substrate 1 and drain electrode 37 in which hollow region 4 is not located, an electric field alleviation region ER is formed by insulating films 2, 20, 17 and a floating silicon layer 21. Thus, as described above in connection with FIG. 3, the voltage between drain electrode 37 to which a high voltage of approximately 1000 V is applied and semiconductor substrate 1 fixed at the ground potential is dropped by a voltage drop across capacitor C1V and a voltage drop across capacitor C2V, and thus the vertical electric field is alleviated.

Second Example

Figure 13:
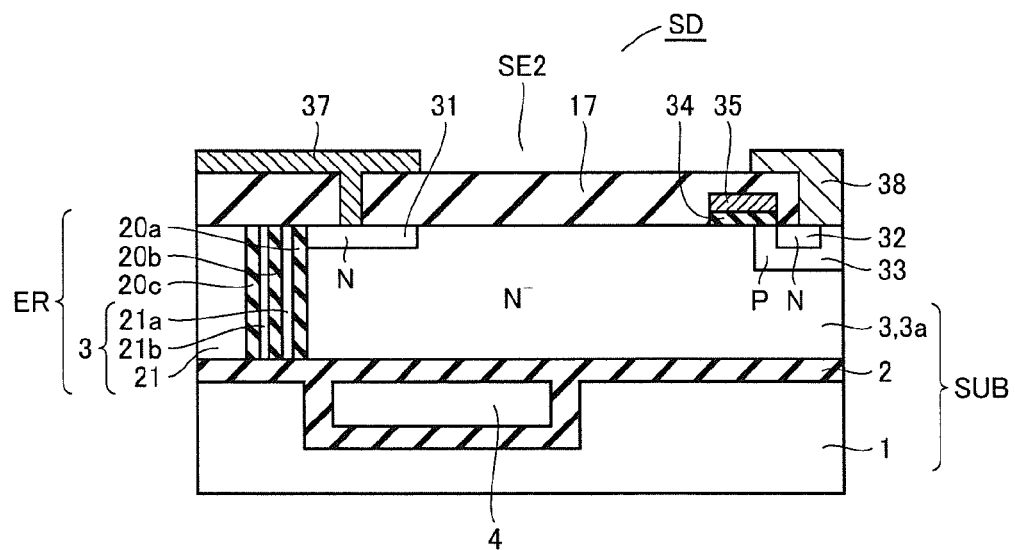
FIGS. 13 to 16 are partial cross-sectional views showing respective semiconductor devices of second to fifth examples according to the sixth embodiment.

As an electric field alleviation region in the present semiconductor device SD, an electric field alleviation region ER similar to electric field alleviation region ER shown in FIG. 4 may be applied as shown in FIG. 13 by forming insulating films 20a, 20b, 20c so that they extend from the surface of N⁻ semiconductor layer 3 to insulating film 2 and are spaced from each other.

In this case, as described above in connection with FIG. 5, the voltage between drain electrode 37 (N⁻ semiconductor layer 3a) to which a high voltage of approximately 1000 V is applied and floating silicon layer 21 is dropped by a voltage drop across capacitor C1H, a voltage drop across capacitor C2H, and a voltage drop across capacitor C3H, and thus the lateral electric field is alleviated.

Third Example

Figure 14:
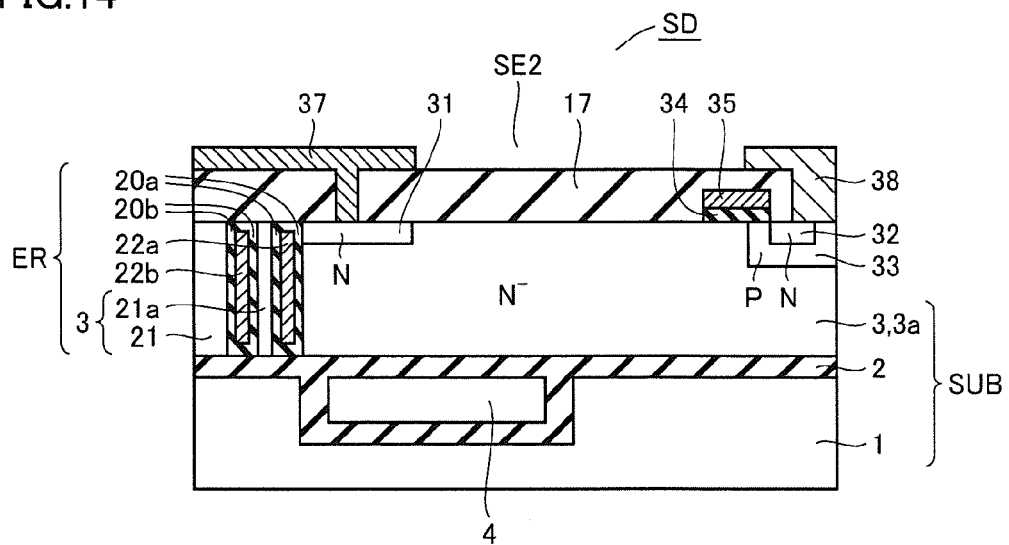

As an electric field alleviation region in the present semiconductor device SD, an electric field alleviation region ER similar to electric field alleviation region ER shown in FIG. 6 may be applied as shown in FIG. 14 by forming insulating films 20a, 20b so that they cover respective sidewalls of trenches extending from the surface of N⁻ semiconductor layer 3 to insulating film 2 and further forming polysilicon films 22a, 22b, which are each isolated electrically, so that they fill the trenches respectively.

In this case, as described above in connection with FIG. 7, the voltage between drain electrode 37 (N⁻ semiconductor layer 3a) to which a high voltage of approximately 1000 V is applied and floating silicon layer 21 is dropped by a voltage drop across capacitor C1H, a voltage drop across capacitor C2H, a voltage drop across capacitor C3H, and a voltage drop across capacitor C4H. Consequently, in semiconductor device SD, particularly the lateral electric field is alleviated. Moreover, electric field alleviation region ER is formed simultaneously with the trench isolation structure provided for electrically isolating the semiconductor element, and therefore, electric field alleviation region ER can be formed without increasing the number of manufacturing steps.

Fourth Example

Figure 15:
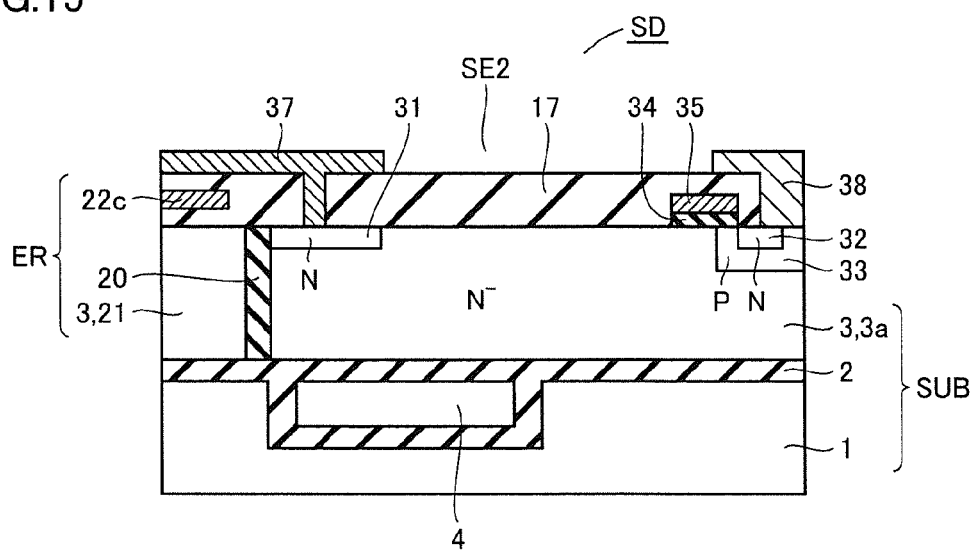

As an electric field alleviation region in the present semiconductor device SD, an electric field alleviation region ER similar to electric field alleviation region ER shown in FIG. 8 may be applied as shown in FIG. 15 by forming an electrically-isolated polysilicon film 22c in insulating film 17.

In this case, as described above in connection with FIG. 9, the voltage between drain electrode 37 (N⁻ semiconductor layer 3a) to which a high voltage of approximately 1000 V is applied and semiconductor substrate 1 fixed at the ground potential is dropped by a voltage drop across capacitor C1V, a voltage drop across capacitor C2V, and a voltage drop across capacitor C3V. Consequently, in semiconductor device SD, particularly the vertical electric field is alleviated. Moreover, polysilicon film 22c is formed simultaneously with gate electrode 35 of the LDMOS, and therefore, electric field alleviation region ER can be formed without increasing the number of manufacturing steps.

Fifth Example

Figure 16:
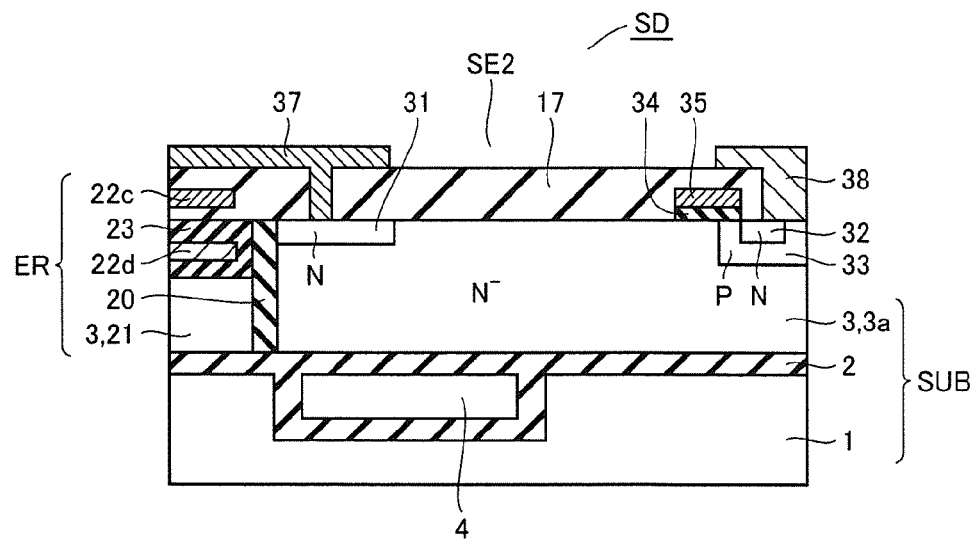

As an electric field alleviation region in the present semiconductor device SD, an electric field alleviation region ER similar to electric field alleviation region ER shown in FIG. 10 may be applied as shown in FIG. 16 by forming, in addition to a polysilicon film 22c in insulating film 17, an insulting film 23 between insulating film 17 and a floating silicon layer 21 and an electrically-isolated polysilicon film 22d in this insulating film 23.

In this case, as described above in connection with FIG. 11, the voltage between drain electrode 37 (N⁻ semiconductor layer 3a) to which a high voltage of approximately 1000 V is applied and semiconductor substrate 1 fixed at the ground potential is dropped by a voltage drop across capacitor C1V, a voltage drop across capacitor C2V, a voltage drop across capacitor C3V, and a voltage drop across capacitor C4V. Consequently, in semiconductor device SD, particularly the vertical electric field is alleviated.

Thus, in the present semiconductor devices (first to fifth examples) each, the region located between drain electrode 37 and semiconductor substrate 1 is provided with hollow region 4 which is formed so that hollow region 4 is opposite to a part of drain electrode 37, as well as a region in which no hollow region is formed. Accordingly, as compared with the semiconductor device in which the hollow region is formed so that the hollow region is opposite to the whole of the drain electrode, the mechanical strength of semiconductor device SD can be prevented from being weakened while the vertical and lateral breakdown voltages are adequately ensured.

Seventh Embodiment

Here, a semiconductor element SE3 (see FIGS. 17 to 21) formed on an SOI substrate will be described with reference to a p-channel LIGBT by way of example.

First Example

Figure 17:
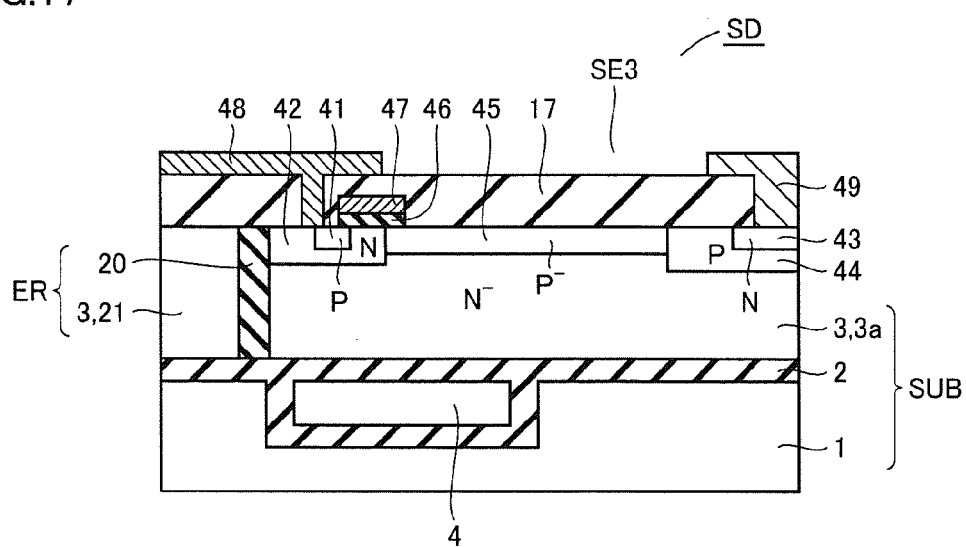
FIG. 17 is a partial cross-sectional view of a semiconductor device of a first example among semiconductor devices according to a seventh embodiment of the present invention.

As shown in FIG. 17, in a portion (N⁻ semiconductor layer 3a) located in a predetermined region of N⁻ semiconductor layer 3, a P-type impurity region 41 serving as an emitter is formed from the surface of N⁻ semiconductor layer 3a to a predetermined depth. An N-type impurity region 42 serving as a body (base) is formed from the surface of N⁻ semiconductor layer 3a to a deeper depth than P-type impurity region 41 so that N-type impurity region 42 surrounds P-type impurity region 41 laterally and from below.

In a portion of N⁻ semiconductor layer 3a spaced from N-type impurity region 42, an N-type impurity region 43 serving as a collector is formed from the surface of N⁻ semiconductor layer 3a to a predetermined depth. A P-type impurity region 44 serving as a drift region is formed from the surface of N⁻ semiconductor layer 3a to a deeper depth than N-type impurity region 43 so that P-type impurity region 44 surrounds N-type impurity region 43 laterally and from below. In a portion of N⁻ semiconductor layer 3a located between N-type impurity region 42 and P-type impurity region 44, a P⁻ impurity region 45 serving as a drift region is formed from the surface of N⁻ semiconductor layer 3a to a predetermined depth.

On the surface of a portion of N-type impurity region 42 that is located between P-type impurity region 41 and P⁻ impurity region 45, a gate electrode 47 is formed with a gate insulating film 46 interposed therebetween. An insulating film 17 is formed to cover gate electrode 47. On a surface of insulating film 17, an emitter electrode 48 contacting P-type impurity region 41 and N-type impurity region 42 through an opening formed in the insulating film is formed. In a predetermined region of the surface of insulating film 17, a collector electrode 49 contacting N-type impurity region 43 through another opening formed in insulating film 17 is formed.

Features other than those described above such as hollow region 4 and electric field alleviation region ER are similar to those of semiconductor device SD shown in FIG. 1, and therefore the same components are denoted by the same reference characters and the description thereof will not be repeated.

In the following, an operation will be described of semiconductor element SE3 (p-channel LIGBT) in semiconductor device SD as described above. Application of a voltage lower than a predetermined threshold voltage (<0 V) to gate electrode 47 causes a p-type channel to be formed in a portion of N-type impurity region 42 that is located directly below gate electrode 47. As the channel is formed, holes are injected from emitter electrode 48 through P-type impurity region 41, the channel, and P⁻ impurity region 45 to N⁻ semiconductor layer 3a, while electrons are injected from collector electrode 49 through N-type impurity region 43 to N⁻ semiconductor layer 3a. Accordingly, the resistance value of N⁻ semiconductor layer 3a is decreased due to conductivity modulation, which causes a state in which current flows from the emitter side toward the collector side (ON state).

In contrast, application of a voltage higher than the threshold voltage to gate electrode 47 causes the channel formed in N-type impurity region 42 to disappear. As the channel disappears, holes are stopped from being injected to N⁻ semiconductor layer 3a, the electrons and holes accumulated in N⁻ semiconductor layer 3a are recombined to thereby disappear or discharged to emitter electrode 48 or collector electrode 49 to thereby disappear, resulting in a state in which current is cut off (OFF state).

When semiconductor element SE3 (p-channel LIGBT) in the above-described semiconductor device SD is OFF state, a high voltage is applied to emitter electrode 48 relative to collector electrode 49, and N⁻ semiconductor layer 3a is almost entirely depleted. At this time, as described above in connection with the first embodiment, the electric field generated at the interface between insulating film 2 and N⁻ semiconductor layer 3a which has been depleted almost entirely is alleviated by hollow region 4.

Meanwhile, in a region between semiconductor substrate 1 and emitter electrode 48 in which hollow region 4 is not located, an electric field alleviation region ER is formed by insulating films 2, 20, 17 and a floating silicon layer 21. Accordingly, as described above in connection with FIG. 3, the voltage between emitter electrode 48 to which a high voltage is applied relative to collector electrode 49 and semiconductor substrate 1 fixed at the ground potential is dropped by a voltage drop across capacitor C1V and a voltage drop across capacitor C2V, and thus the vertical electric field is alleviated.

Second Example

Figure 18:
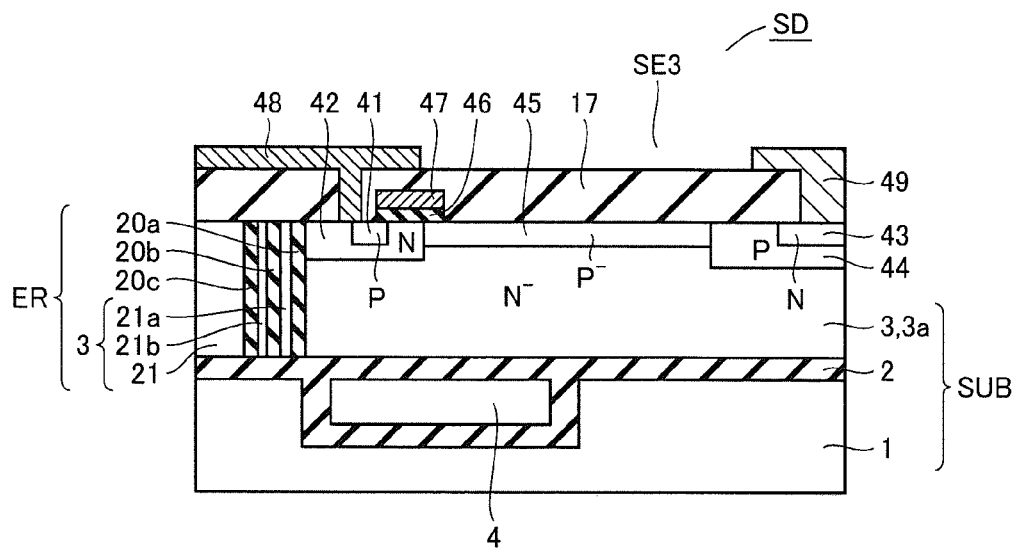
FIGS. 18 to 21 are partial cross-sectional views showing respective semiconductor devices of second to fifth examples according to the seventh embodiment.

As an electric field alleviation region in the present semiconductor device SD, an electric field alleviation region ER similar to electric field alleviation region ER shown in FIG. 4 may be applied as shown in FIG. 18 by forming insulating films 20a, 20b, 20c so that they extend from the surface of N⁻ semiconductor layer 3 to insulating film 2 and are spaced from each other.

In this case, as described above in connection with FIG. 5, the voltage between emitter electrode 48 (N⁻ semiconductor layer 3a) to which a high voltage is applied and floating silicon layer 21 is dropped by a voltage drop across capacitor C1H, a voltage drop across capacitor C2H, and a voltage drop across capacitor C3H, and thus the lateral electric field is alleviated.

Third Example

Figure 19:
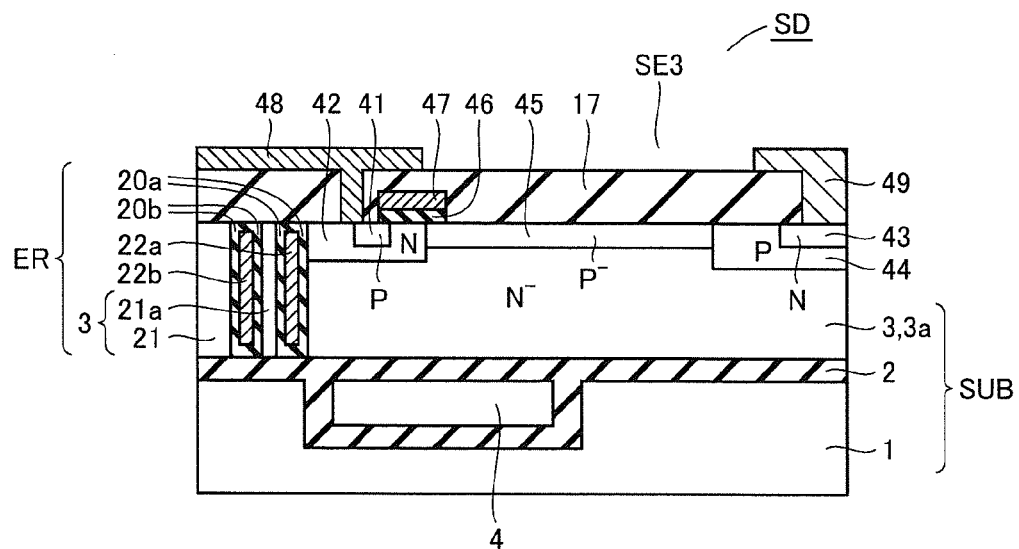

As an electric field alleviation region in the present semiconductor device SD, an electric field alleviation region ER similar to electric field alleviation region ER shown in FIG. 6 may be applied as shown in FIG. 19 by forming insulating films 20a, 20b so that they cover respective sidewalls of trenches extending from the surface of N⁻ semiconductor layer 3 to insulating film 2 and further forming polysilicon films 22a, 22b, which are each isolated electrically, so that they fill the trenches respectively.

In this case, as described above in connection with FIG. 7, the voltage between emitter electrode 48 (N⁻ semiconductor layer 3a) to which a high voltage is applied and floating silicon layer 21 is dropped by a voltage drop across capacitor C1H, a voltage drop across capacitor C2H, a voltage drop across capacitor C3H, and a voltage drop across capacitor C4H. Consequently, in semiconductor device SD, particularly the lateral electric field is alleviated. Moreover, electric field alleviation region ER is formed simultaneously with the trench isolation structure provided for electrically isolating the semiconductor element, and therefore, electric field alleviation region ER can be formed without increasing the number of manufacturing steps.

Fourth Example

Figure 20:
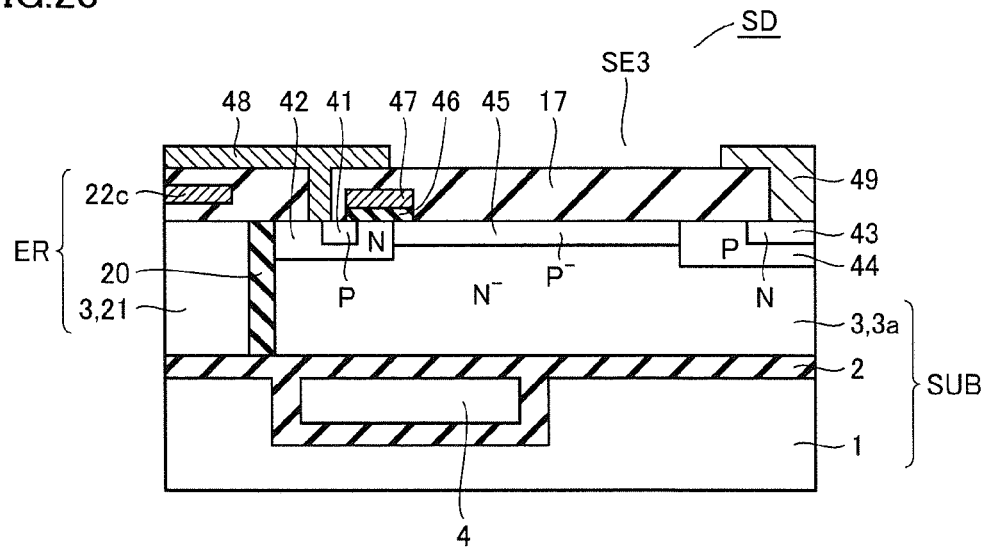

As an electric field alleviation region in the present semiconductor device SD, an electric field alleviation region ER similar to electric field alleviation region ER shown in FIG. 8 may be applied as shown in FIG. 20 by forming an electrically-isolated polysilicon film 22c in insulating film 17.

In this case, as described above in connection with FIG. 9, the voltage between emitter electrode 48 to which a high voltage is applied and semiconductor substrate 1 fixed at the ground potential is dropped by a voltage drop across capacitor C1V, a voltage drop across capacitor C2V, and a voltage drop across capacitor C3V. Consequently, in semiconductor device SD, particularly the vertical electric field is alleviated. Moreover, polysilicon film 22c is formed simultaneously with gate electrode 47 of the LDMOS, and therefore, electric field alleviation region ER can be formed without increasing the number of manufacturing steps.

Fifth Example

Figure 21:
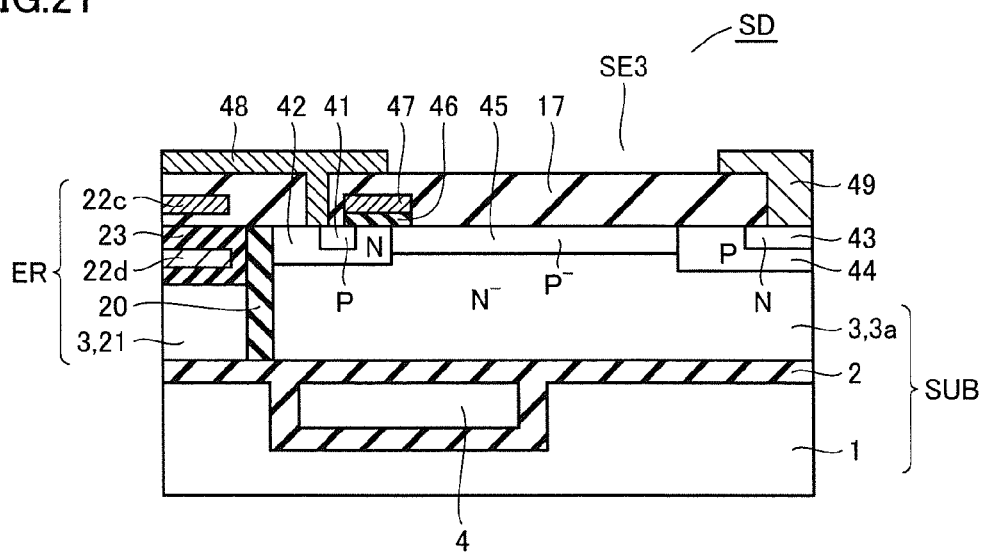

As an electric field alleviation region in the present semiconductor device SD, an electric field alleviation region ER similar to electric field alleviation region ER shown in FIG. 10 may be applied as shown in FIG. 21 by forming, in addition to a polysilicon film 22c in insulating film 17, an insulting film 23 between insulating film 17 and a floating silicon layer 21 and an electrically-isolated polysilicon film 22d in this insulating film 23.

In this case, as described above in connection with FIG. 11, the voltage between emitter electrode 48 (N⁻ semiconductor layer 3a) to which a high voltage is applied and semiconductor substrate 1 fixed at the ground potential is dropped by a voltage drop across capacitor C1V, a voltage drop across capacitor C2V, a voltage drop across capacitor C3V, and a voltage drop across capacitor C4V. Consequently, in semiconductor device SD, particularly the vertical electric field is alleviated.

Thus, in the present semiconductor devices (first to fifth examples) each, the region located between emitter electrode 48 and semiconductor substrate 1 is provided with hollow region 4 which is formed so that hollow region 4 is opposite to a part of emitter electrode 48, as well as a region in which no hollow region is formed. Accordingly, as compared with the semiconductor device in which the hollow region is formed so that the hollow region is opposite to the whole of the emitter electrode, the mechanical strength of semiconductor device SD can be prevented from being weakened while the vertical and lateral breakdown voltages are adequately ensured.

Eighth Embodiment

Here, a semiconductor element SE4 (see FIGS. 22 to 26) formed on an SOI substrate will be described with reference to a p-channel lateral DMOS (LDMOS) by way of example.

First Example

Figure 22:
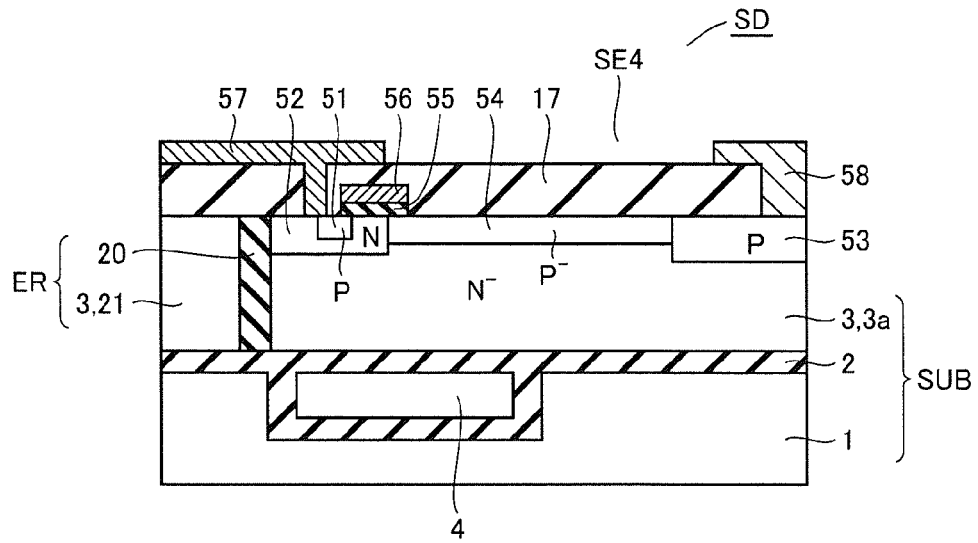
FIG. 22 is a partial cross-sectional view of a semiconductor device of a first example among semiconductor devices according to an eighth embodiment of the present invention.

As shown in FIG. 22, in a portion (N⁻ semiconductor layer 3a) located in a predetermined region of N⁻ semiconductor layer 3, a P-type impurity region 51 serving as a source is formed from the surface of N⁻ semiconductor layer 3a to a predetermined depth. An N-type impurity region 52 serving as a body (base) is formed from the surface of N⁻ semiconductor layer 3a to a deeper depth than P-type impurity region 51 so that N-type impurity region 52 surrounds P-type impurity region 51 laterally and from below.

In a portion of N⁻ semiconductor layer 3a that is spaced from N-type impurity region 52, a P-type impurity region 53 serving as a drain is formed from the surface of N⁻ semiconductor layer 3a to a predetermined depth. In a portion of N⁻ semiconductor layer 3a that is located between N-type impurity region 52 and P-type impurity region 53, a P⁻ impurity region 54 serving as a drift region is formed from the surface of N⁻ semiconductor layer 3a to a predetermined depth. On the surface of a portion of N-type impurity region 52 that is located between P-type impurity region 51 and P⁻ impurity region 54, a gate electrode 56 is formed with a gate insulating film 55 interposed therebetween.

An insulating film 17 is formed to cover gate electrode 56. On a surface of insulating film 17, a source electrode 57 contacting P-type impurity region 51 and N-type impurity region 52 through an opening formed in the insulating film is formed. In a predetermined region of the surface of insulating film 17, a drain electrode 58 contacting P-type impurity region 53 through another opening formed in insulating film 17 is formed.

Features other than those described above such as hollow region 4 and electric field alleviation region ER are similar to those of semiconductor device SD shown in FIG. 1, and therefore the same components are denoted by the same reference characters and the description thereof will not be repeated.

In the following, an operation will be described of semiconductor element SE4 (p-channel LDMOS) in semiconductor device SD as described above. Application of a voltage lower than a predetermined threshold voltage (<0 V) to gate electrode 56 causes a p-type channel to be formed in a portion of N-type impurity region 52 that is located directly below gate electrode 56. As the channel is formed, holes flow from source electrode 57 through the channel and P⁻ impurity region 54 to P-type impurity region 53. Accordingly, a state is caused in which current flows from the source side toward the drain side (ON state).

In contrast, application of a voltage higher than the threshold voltage to gate electrode 56 causes the channel formed in N-type impurity region 52 to disappear. As the channel disappears, holes are stopped from flowing to P⁻ impurity region 54, which causes a state in which current is cut off (OFF state).

When semiconductor element SE4 (p-channel LDMOS) in the above-described semiconductor device SD is OFF state, a high voltage is applied to source electrode 57 relative to drain electrode 58, and N⁻ semiconductor layer 3a is almost entirely depleted. At this time, as described above in connection with the first embodiment, the electric field generated at the interface between insulating film 2 and N⁻ semiconductor layer 3a which has been depleted almost entirely is alleviated by hollow region 4.

Meanwhile, in a region between semiconductor substrate 1 and source electrode 57 in which hollow region 4 is not located, an electric field alleviation region ER is formed by insulating films 2, 20, 17 and a floating silicon layer 21. Accordingly, as described above in connection with FIG. 3, the voltage between source electrode 57 to which a high voltage is applied relative to drain electrode 58 and semiconductor substrate 1 fixed at the ground potential is dropped by a voltage drop across capacitor C1V and a voltage drop across capacitor C2V, and thus the vertical electric field is alleviated.

Second Example

Figure 23:
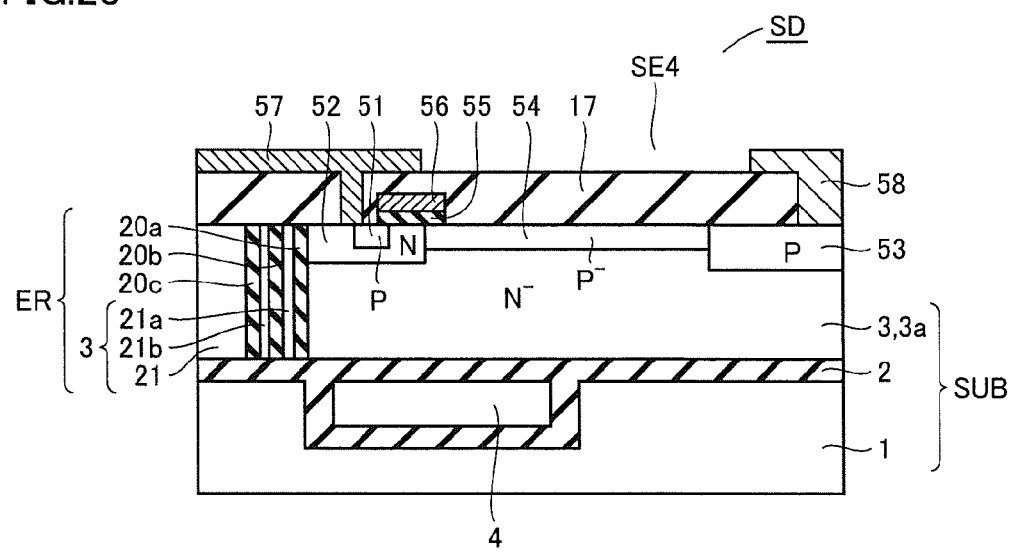
FIGS. 23 to 26 are partial cross-sectional views showing respective semiconductor devices of second to fifth examples according to the eighth embodiment.

As an electric field alleviation region in the present semiconductor device SD, an electric field alleviation region ER similar to electric field alleviation region ER shown in FIG. 4 may be applied as shown in FIG. 23 by forming insulating films 20a, 20b, 20c so that they extend from the surface of N⁻ semiconductor layer 3 to insulating film 2 and are spaced from each other.

In this case, as described above in connection with FIG. 5, the voltage between source electrode 57 (N⁻ semiconductor layer 3a) to which a high voltage is applied and floating silicon layer 21 is dropped by a voltage drop across capacitor C1H, a voltage drop across capacitor C2H, and a voltage drop across capacitor C3H, and thus the lateral electric field is alleviated.

Third Example

Figure 24:
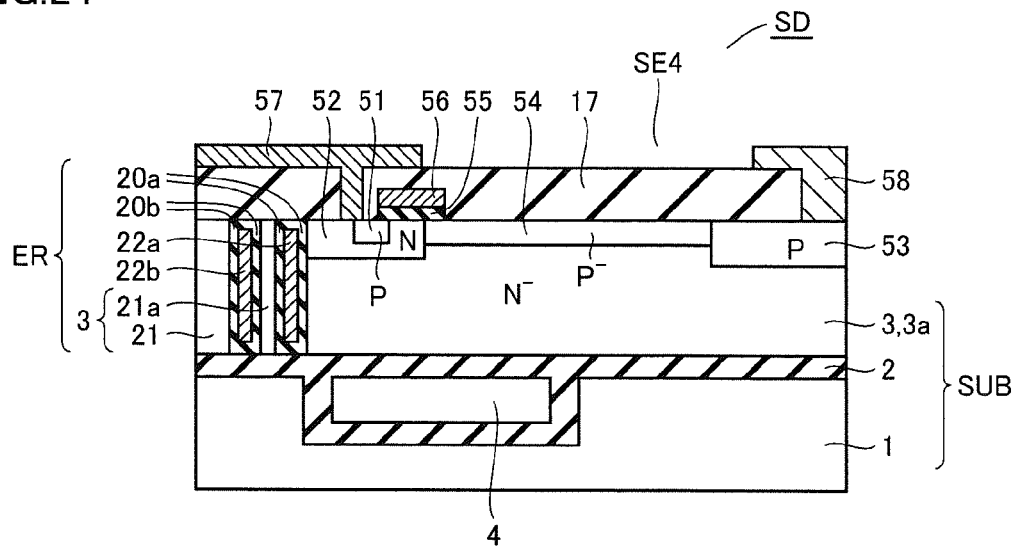

As an electric field alleviation region in the present semiconductor device SD, an electric field alleviation region ER similar to electric field alleviation region ER shown in FIG. 6 may be applied as shown in FIG. 24 by forming insulating films 20a, 20b so that they cover respective sidewalls of trenches extending from the surface of N⁻ semiconductor layer 3 to insulating film 2 and further forming polysilicon films 22a, 22b, which are each isolated electrically, so that they fill the trenches respectively.

In this case, as described above in connection with FIG. 7, the voltage between source electrode 57 (N⁻ semiconductor layer 3a) to which a high voltage is applied and floating silicon layer 21 is dropped by a voltage drop across capacitor C1H, a voltage drop across capacitor C2H, a voltage drop across capacitor C3H, and a voltage drop across capacitor C4H. Consequently, in semiconductor device SD, particularly the lateral electric field is alleviated. Moreover, electric field alleviation region ER is formed simultaneously with the trench isolation structure provided for electrically isolating the semiconductor element, and therefore, electric field alleviation region ER can be formed without increasing the number of manufacturing steps.

Fourth Example

Figure 25:
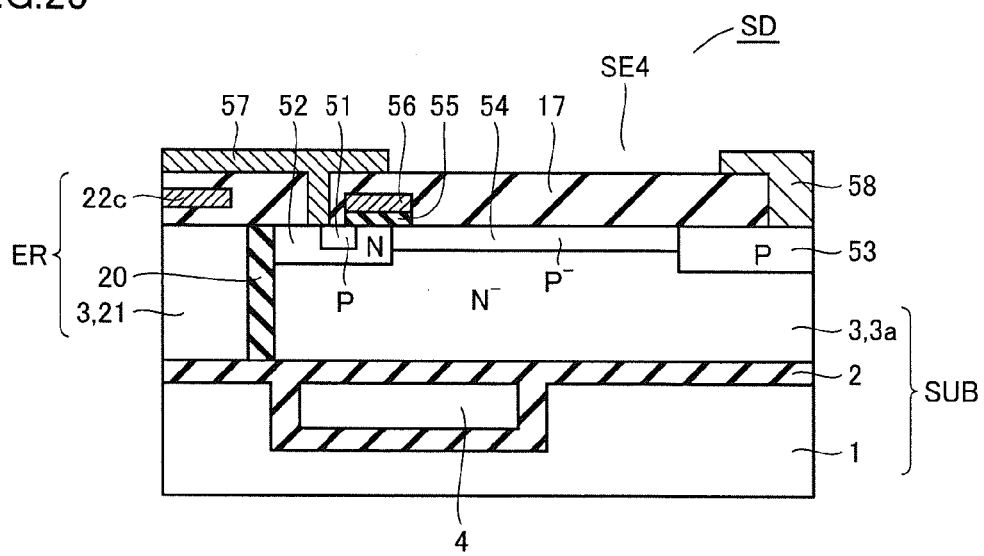

As an electric field alleviation region in the present semiconductor device SD, an electric field alleviation region ER similar to electric field alleviation region ER shown in FIG. 8 may be applied as shown in FIG. 25 by forming an electrically-isolated polysilicon film 22c in insulating film 17.

In this case, as described above in connection with FIG. 9, the voltage between source electrode 57 to which a high voltage is applied and semiconductor substrate 1 fixed at the ground potential is dropped by a voltage drop across capacitor C1V, a voltage drop across capacitor C2V, and a voltage drop across capacitor C3V. Consequently, in semiconductor device SD, particularly the vertical electric field is alleviated. Moreover, polysilicon film 22c is formed simultaneously with gate electrode 56 of the LDMOS, and therefore, electric field alleviation region ER can be formed without increasing the number of manufacturing steps.

Fifth Example

Figure 26:
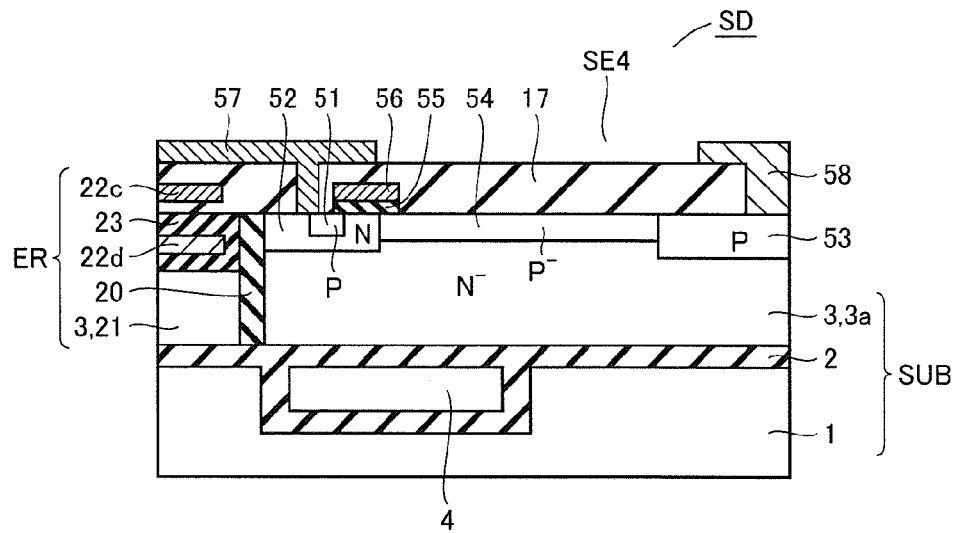

As an electric field alleviation region in the present semiconductor device SD, an electric field alleviation region ER similar to electric field alleviation region ER shown in FIG. 10 may be applied as shown in FIG. 26 by forming, in addition to a polysilicon film 22c in insulating film 17, an insulting film 23 between insulating film 17 and a floating silicon layer 21 and an electrically-isolated polysilicon film 22d in this insulating film 23.

In this case, as described above in connection with FIG. 11, the voltage between source electrode 57 (N⁻ semiconductor layer 3a) to which a high voltage is applied and semiconductor substrate 1 fixed at the ground potential is dropped by a voltage drop across capacitor C1V, a voltage drop across capacitor C2V, a voltage drop across capacitor C3V, and a voltage drop across capacitor C4V. Consequently, in semiconductor device SD, particularly the vertical electric field is alleviated.

Thus, in the present semiconductor devices (first to fifth examples) each, the region located between source electrode 57 and semiconductor substrate 1 is provided with hollow region 4 which is formed so that hollow region 4 is opposite to a part of source electrode 57, as well as a region in which no hollow region is formed. Accordingly, as compared with the semiconductor device in which the hollow region is formed so that the hollow region is opposite to the whole of the source electrode, the mechanical strength of semiconductor device SD can be prevented from being weakened while the vertical and lateral breakdown voltages are adequately ensured.

Ninth Embodiment

Here, a semiconductor element SE5 (see FIGS. 27 to 31) formed on an SOI substrate will be described with reference to a lateral PIN (P Intrinsic N) diode by way of example.

First Example

Figure 27:
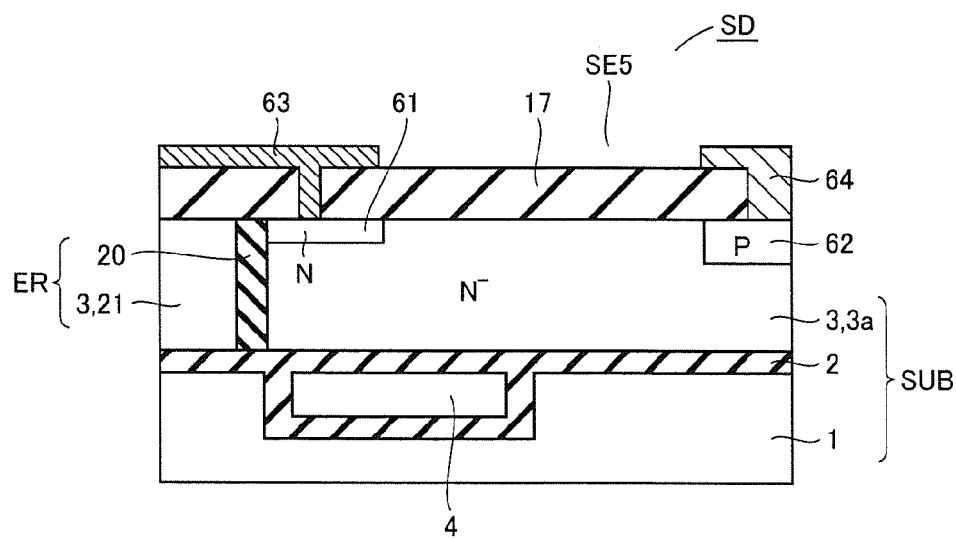
FIG. 27 is a partial cross-sectional view of a semiconductor device of a first example among semiconductor devices according to a ninth embodiment of the present invention.

As shown in FIG. 27, in a portion (N⁻ semiconductor layer 3a) located in a predetermined region of N⁻ semiconductor layer 3, an N-type impurity region 61 serving as a cathode is formed from the surface of N⁻ semiconductor layer 3a to a predetermined depth. In a portion of N⁻ semiconductor layer 3a that is spaced from N-type impurity region 61, a P-type impurity region 62 serving as an anode is formed from the surface of N⁻ semiconductor layer 3a to a predetermined depth.

An insulating film 17 is formed to cover N-type impurity region 61 and P-type impurity region 62. In a predetermined region of the surface of insulating film 17, a cathode electrode 63 contacting N-type impurity region 61 through an opening formed in the insulating film is formed. On a surface of insulating film 17, an anode electrode 64 contacting P-type impurity region 62 through another opening formed in insulating film 17 is formed.

Features other than those described above such as hollow region 4 and electric field alleviation region ER are similar to those of semiconductor device SD shown in FIG. 1, and therefore the same components are denoted by the same reference characters and the description thereof will not be repeated.

In the following, an operation will be described of semiconductor element SE5 (PIN diode) in semiconductor device SD as described above. Application of a positive voltage to anode electrode 64 and application of a negative voltage to cathode electrode 63 (forward direction) cause electrons to be injected from N-type impurity region 61 to N⁻ semiconductor layer 3a and cause holes to be injected from P-type impurity region 62 to N⁻ semiconductor layer 3a, and thus the electrical conductivity of N⁻ semiconductor layer 3a increases, which causes a state in which current flows from the anode side toward the cathode side (forward bias state).

In contrast, application of a negative voltage to anode electrode 64 and application of a positive voltage to cathode electrode 63 (reverse direction) cause the electrons and holes having been injected to N⁻ semiconductor layer 3a to finally disappear, which causes a state in which current is cut off (reverse bias state).

When semiconductor element SE5 (PIN diode) in the above-described semiconductor device SD is a reverse bias state, a positive voltage is applied to cathode electrode 63 and a negative voltage is applied to anode electrode 64 and thus N⁻ semiconductor layer 3a is almost entirely depleted. At this time, as described above, the electric field generated at the interface between insulating film 2 and N⁻ semiconductor layer 3a which has been depleted almost entirely is alleviated by hollow region 4.

Meanwhile, in a region between semiconductor substrate 1 and cathode electrode 63 in which hollow region 4 is not located, an electric field alleviation region ER is formed by insulating films 2, 20, 17 and a floating silicon layer 21. Accordingly, as described above in connection with FIG. 3, the voltage between cathode electrode 63 to which a positive voltage is applied and semiconductor substrate 1 fixed at the ground potential is dropped by a voltage drop across capacitor C1V and a voltage drop across capacitor C2V, and thus the vertical electric field is alleviated.

Second Example

Figure 28:
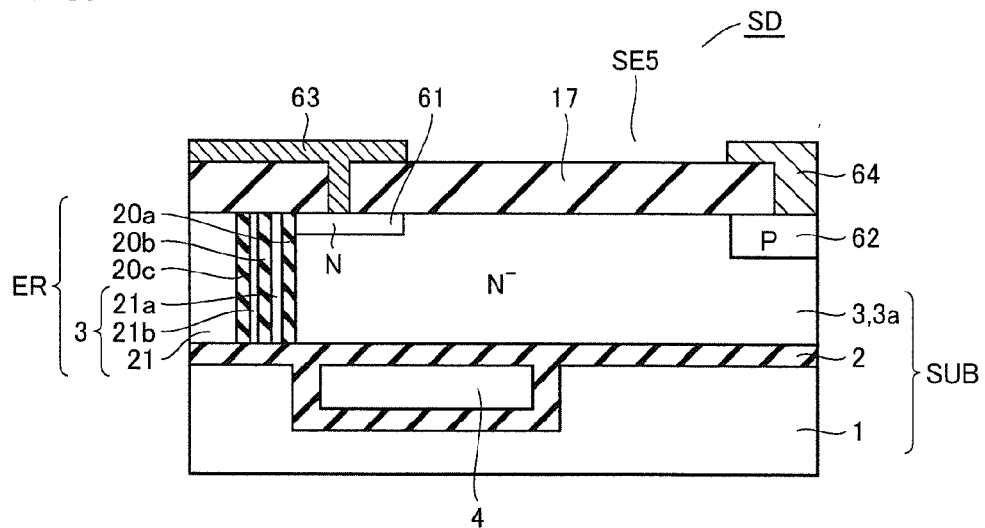
FIGS. 28 to 31 are partial cross-sectional views showing respective semiconductor devices of second to fifth examples according to the ninth embodiment.

As an electric field alleviation region in the present semiconductor device SD, an electric field alleviation region ER similar to electric field alleviation region ER shown in FIG. 4 may be applied as shown in FIG. 28 by forming insulating films 20a, 20b, 20c so that they extend from the surface of N⁻ semiconductor layer 3 to insulating film 2 and are spaced from each other.

In this case, as described above in connection with FIG. 5, the voltage between cathode electrode 63 (N⁻ semiconductor layer 3a) to which a positive voltage is applied and floating silicon layer 21 is dropped by a voltage drop across capacitor C1H, a voltage drop across capacitor C2H, and a voltage drop across capacitor C3H, and thus the lateral electric field is alleviated.

Third Example

Figure 29:
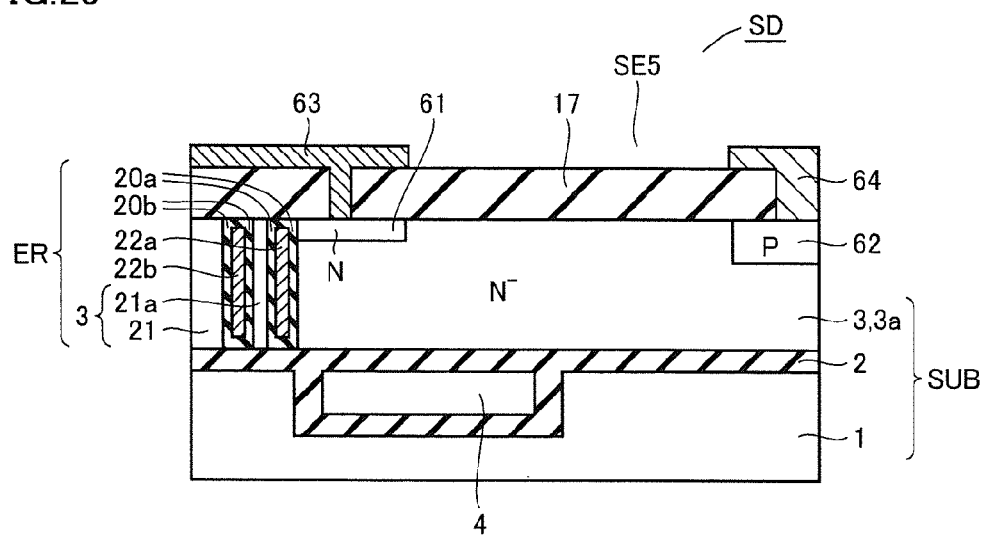

As an electric field alleviation region in the present semiconductor device SD, an electric field alleviation region ER similar to electric field alleviation region ER shown in FIG. 6 may be applied as shown in FIG. 29 by forming insulating films 20a, 20b so that they cover respective sidewalls of trenches extending from the surface of N⁻ semiconductor layer 3 to insulating film 2 and further forming polysilicon films 22a, 22b, which are each isolated electrically, so that they fill the trenches respectively.

In this case, as described above in connection with FIG. 7, the voltage between cathode electrode 63 (N⁻ semiconductor layer 3a) to which a positive voltage is applied and floating silicon layer 21 is dropped by a voltage drop across capacitor C1H, a voltage drop across capacitor C2H, a voltage drop across capacitor C3H, and a voltage drop across capacitor C4H. Consequently, in semiconductor device SD, particularly the lateral electric field is alleviated. Moreover, electric field alleviation region ER is formed simultaneously with the trench isolation structure provided for electrically isolating the semiconductor element, and therefore, electric field alleviation region ER can be formed without increasing the number of manufacturing steps.

Fourth Example

Figure 30:
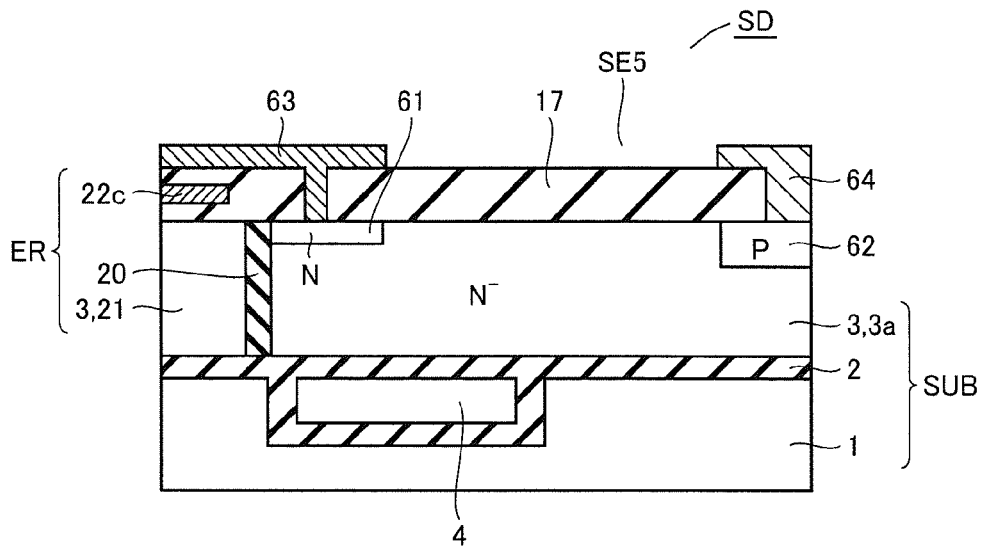

As an electric field alleviation region in the present semiconductor device SD, an electric field alleviation region ER similar to electric field alleviation region ER shown in FIG. 8 may be applied as shown in FIG. 30 by forming an electrically-isolated polysilicon film 22c in insulating film 17.

In this case, as described above in connection with FIG. 9, the voltage between cathode electrode 63 to which a positive voltage is applied and semiconductor substrate 1 fixed at the ground potential is dropped by a voltage drop across capacitor C1V, a voltage drop across capacitor C2V, and a voltage drop across capacitor C3V. Consequently, in semiconductor device SD, particularly the vertical electric field is alleviated.

Fifth Example

Figure 31:
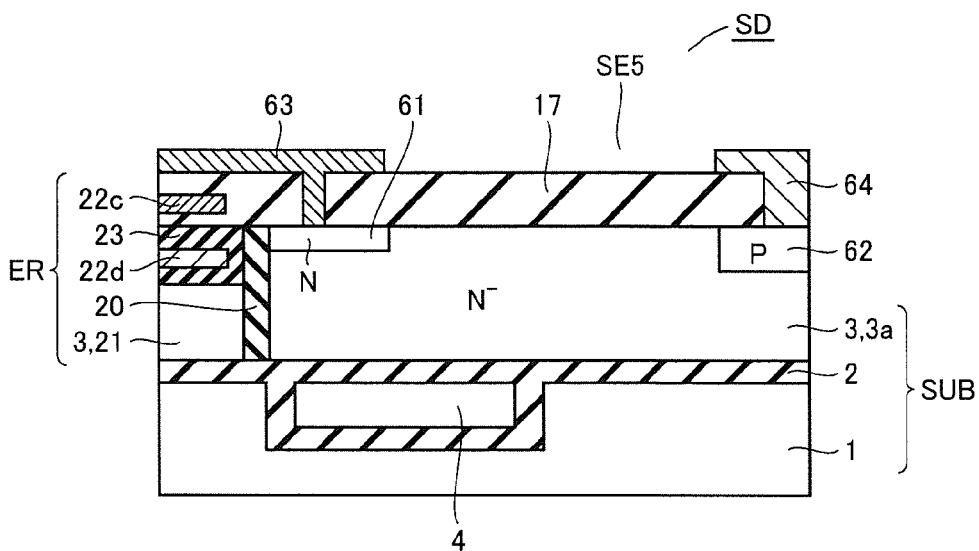

As an electric field alleviation region in the present semiconductor device SD, an electric field alleviation region ER similar to electric field alleviation region ER shown in FIG. 10 may be applied as shown in FIG. 31 by forming, in addition to a polysilicon film 22c in insulating film 17, an insulting film 23 between insulating film 17 and a floating silicon layer 21 and an electrically-isolated polysilicon film 22d in this insulating film 23.

In this case, as described above in connection with FIG. 11, the voltage between cathode electrode 63 (N⁻ semiconductor layer 3a) to which a positive voltage is applied and semiconductor substrate 1 fixed at the ground potential is dropped by a voltage drop across capacitor C1V, a voltage drop across capacitor C2V, a voltage drop across capacitor C3V, and a voltage drop across capacitor C4V. Consequently, in semiconductor device SD, particularly the vertical electric field is alleviated.

Thus, in the present semiconductor devices (first to fifth examples) each, the region located between cathode electrode 63 and semiconductor substrate 1 is provided with hollow region 4 which is formed so that hollow region 4 is opposite to a part of cathode electrode 63, as well as a region in which no hollow region is formed. Accordingly, as compared with the semiconductor device in which the hollow region is formed so that the hollow region is opposite to the whole of the cathode electrode, the mechanical strength of semiconductor device SD can be prevented from being weakened while the vertical and lateral breakdown voltages are adequately ensured.

Regarding respective semiconductor devices of the embodiments described above, the same disposition structure has been illustrated, namely hollow region 4 is disposed in the same manner with respect to N⁻ semiconductor layer 3a and floating silicon layer 21. The following are possible variations of the disposition structure of hollow region 4. Namely, in terms of the positional relationship between N⁻ semiconductor layer 3a and a region (region A) in semiconductor substrate 1 that is surrounded by hollow region 4 having an influence on the breakdown voltage, there are a disposition structure (disposition structure A) in which hollow region 4 is disposed so that region A of semiconductor substrate 1 and N⁻ semiconductor layer 3a have no respective portions opposite to each other with insulating film 2 (BOX layer) interposed therebetween, and a disposition structure (disposition structure B) in which hollow region 4 is disposed so that they have respective portions opposite to each other.

Figure 32:
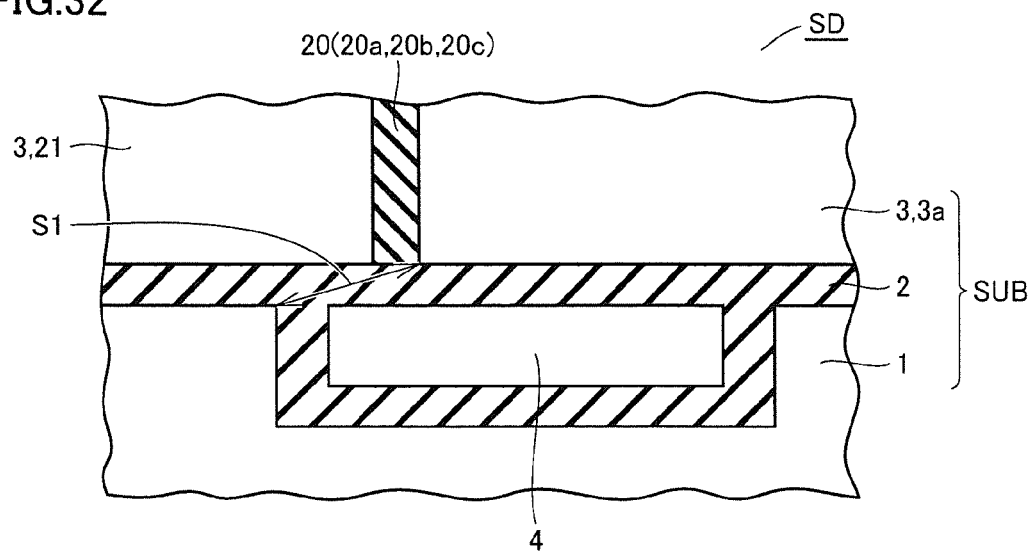
FIG. 32 is a first partial cross-sectional view showing a structure in which a hollow region is disposed in each embodiment of the present invention.
Figure 33:
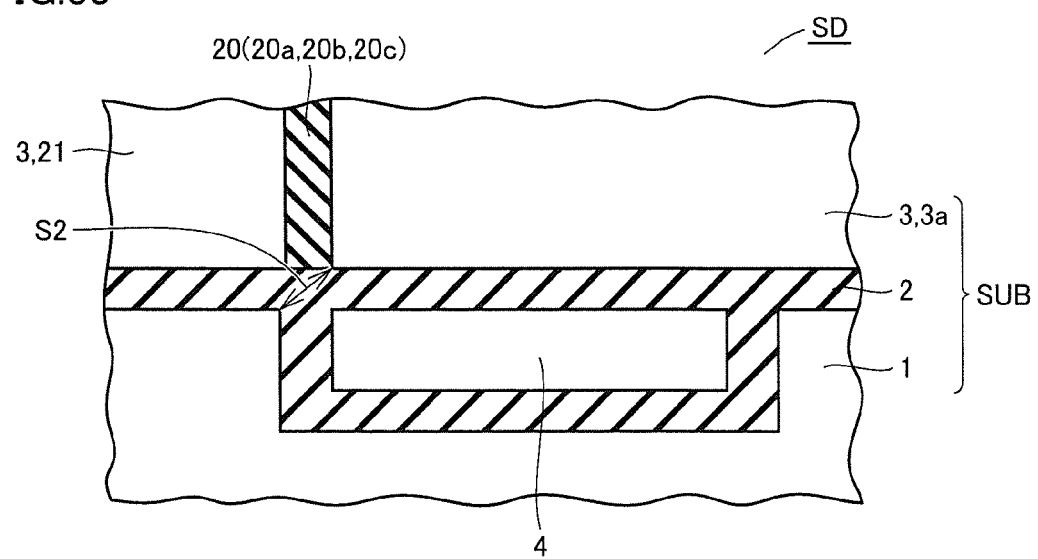
FIG. 33 is a second partial cross-sectional view showing a structure in which a hollow region is disposed in each embodiment of the present invention.

Disposition structure A may be, other than the disposition structure of hollow region 4 in the semiconductor device of each embodiment described above, a disposition structure (disposition structure A1) as shown in FIG. 32 in which hollow region 4 extends from a region directly below N⁻ semiconductor layer 3a to a region directly below floating silicon layer 21. It may also be a disposition structure (disposition structure A2) as shown in FIG. 33 in which hollow region 4 is disposed so that insulating film 20 for example is located directly above insulating film 2 which is located laterally with respect to hollow region 4.

Regarding disposition structure A1, an adequate distance S1 between region A of semiconductor substrate 1 to which the ground potential is applied and N⁻ semiconductor layer 3a to which a high voltage is applied is ensured, which is advantageous in terms of the breakdown voltage (in terms of the electric field). As for this disposition structure A1, however, since hollow region 4 is located directly below a region in which a trench is to be formed in the process of forming the trench to be filled with insulating film 20 in N⁻ semiconductor layer 3, a higher precision is required for the manufacturing process. As for disposition structure A2, a distance S2 between region A of semiconductor substrate 1 and N⁻ semiconductor layer 3a is shorter than distance S1 (see FIG. 32). The distance, however, is still sufficient as a distance for ensuring an adequate breakdown voltage.

Figure 34:
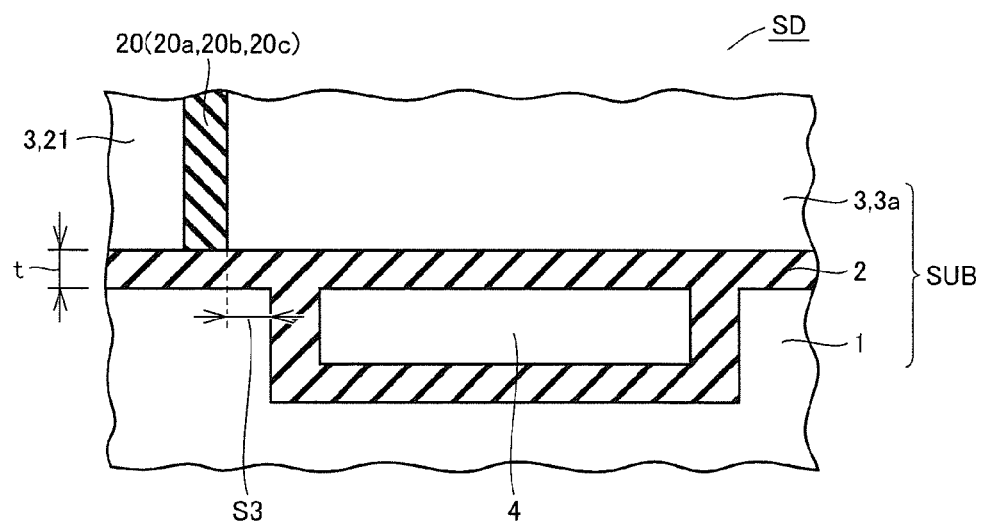
FIG. 34 is a third partial cross-sectional view showing a structure in which a hollow region is disposed in each embodiment of the present invention.

In contrast, disposition structure B may be a disposition structure as shown in FIG. 34 in which hollow region 4 is disposed so that region A of semiconductor substrate 1 extends to a region directly below N⁻ semiconductor layer 3a. As for this disposition structure B, when a trench to be filled with insulating film 20 is to be formed in N⁻ semiconductor layer 3, region A of semiconductor substrate 1 is located directly below the region where the trench is to be formed. Disposition structure B is therefore advantageous in terms of the manufacturing process.

As for disposition structure B, however, since region A of semiconductor substrate 1 to which the ground potential is applied and N⁻ semiconductor layer 3a to which a high voltage is applied include respective portions that are opposite to each other with insulating film 2 having thickness t interposed therebetween. Thus, disposition structure B is generally less advantageous in terms of the breakdown voltage (electric field). Thus, according to evaluation made by the inventors, it has found necessary to define distance S3 over which region A of semiconductor substrate 1 and semiconductor layer 3a are opposite to each other, so that distance S3 is substantially equal to the lateral length of N-type impurity region 12 (see for example FIG. 1), N-type impurity region 31 (see for example FIG. 12), N-type impurity region 42 (see for example FIG. 17), N-type impurity region 52 (see for example FIG. 22), or N-type impurity region 61 (see for example FIG. 27).

Furthermore, regarding respective semiconductor devices of the embodiments described above, the semiconductor element formed in N⁻ semiconductor layer 3a has been described with reference to IGBT, DMOS, and PIN diode by way of example. As the semiconductor element, a semiconductor element such as MOS transistor, bipolar transistor, diode, diffused resistor, and capacitor, for example, may be formed other than the above-referenced semiconductor elements.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a semiconductor substrate having a main surface with a ground voltage applied to said semiconductor substrate;
    a first insulating film formed to cover said main surface of said semiconductor substrate;
    a semiconductor layer of a predetermined conductivity type formed to cover said first insulating film;
    a second insulating film formed to cover said semiconductor layer; and
    a first electrode formed to cover a predetermined region of said second insulating film with a predetermined voltage higher than said ground voltage applied to said first electrode,
    in a region located between said first electrode and said semiconductor substrate, there being located:
        a region where a hollow is formed between said semiconductor substrate and said first insulating film; and
        a region where no hollow is formed between said semiconductor substrate and said first insulating film,
    in a portion of said semiconductor layer that is located directly above said region where said hollow is formed, an element-formed region being formed which is electrically connected to said first electrode and in which a predetermined semiconductor element is formed,
    between said first electrode and a portion of said semiconductor substrate that is located in said region where no hollow is formed, an electric field alleviation region being formed, and
    in said electric field alleviation region, a plurality of capacitors being formed that are connected in series between said predetermined voltage applied to said first electrode and said ground voltage applied to said semiconductor substrate.

2. The semiconductor device according to claim 1, wherein
    in said element-formed region, an n-channel lateral insulated gate bipolar transistor including a collector and an emitter is formed as said semiconductor element, and
    said first electrode serves as a collector electrode and is electrically connected to said collector.

3. The semiconductor device according to claim 1, wherein
    in said element-formed region, an n-channel lateral DMOS transistor including a drain and a source is formed as said semiconductor element, and
    said first electrode serves as a drain electrode and is electrically connected to said drain.

4. The semiconductor device according to claim 1, wherein
    in said element-formed region, a p-channel lateral insulated gate bipolar transistor including a collector and an emitter is formed as said semiconductor element, and
    said first electrode serves as an emitter electrode and is electrically connected to said emitter.

5. The semiconductor device according to claim 1, wherein
    in said element-formed region, a p-channel lateral DMOS transistor including a drain and a source is formed as said semiconductor element, and
    said first electrode serves as a source electrode and is electrically connected to said source.

6. The semiconductor device according to claim 1, wherein
    in said element-formed region, a lateral diode including a cathode and an anode is formed as said semiconductor element, and
    said first electrode serves as a cathode electrode and is electrically connected to said cathode.

7. The semiconductor device according to claim 1, wherein
    in said electric field alleviation region, an electrically-isolated floating portion is formed between said first insulating film and said second insulating film, and
    said capacitors include:
        a first capacitor connected between said semiconductor substrate and said floating portion; and
        a second capacitor connected between said first electrode and said floating portion.

8. The semiconductor device according to claim 7, wherein said second capacitor includes an electrically-isolated second electrically conductive portion formed in said second insulating film to form an electrode of said second capacitor.

9. The semiconductor device according to claim 8, wherein said second capacitor includes:
    a fourth insulating film formed between said second insulating film and said floating portion to form a dielectric of said second capacitor; and
    an electrically-isolated third electrically conductive portion formed in said fourth insulating film to form an electrode of said second capacitor.

10. The semiconductor device according to claim 1, wherein said capacitors include third capacitors connected in series between said floating portion and said element-formed region.

11. The semiconductor device according to claim 10, wherein said third capacitors include a plurality of third insulating films formed between said floating portion and said element-formed region and spaced from each other to form respective dielectrics of said third capacitors.

12. The semiconductor device according to claim 11, wherein said third capacitors include electrically-isolated first electrically conductive portions formed respectively in said plurality of third insulating films to form respective electrodes of said third capacitors.

* * * * *